US 6,675,311 B2

(12) United States Patent
Hotta et al.

(10) Patent No.: US 6,675,311 B2
(45) Date of Patent: *Jan. 6, 2004

(54) DATA PROCESSING SYSTEM GENERATING CLOCK SIGNAL FROM AN INPUT CLOCK, PHASE LOCKED TO THE INPUT CLOCK AND USED FOR CLOCKING LOGIC DEVICES

(75) Inventors: Takashi Hotta, Hitachi (JP); Kozaburo Kurita, Hitachi (JP); Masahiro Iwamura, Hitachi (JP); Hideo Maejima, Hitachi (JP); Shigeya Tanaka, Hitachi (JP); Tadaaki Bandoh, Tohkai-mura (JP); Yasuhiro Nakatsuka, Hitachi (JP); Kazuo Kato, Tohkai-mura (JP); Sin-ichi Sinoda, Hitachi (JP)

(73) Assignee: HItachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/002,444

(22) Filed: Dec. 6, 2001

(65) Prior Publication Data

US 2002/0059538 A1 May 16, 2002

Related U.S. Application Data

(63) Continuation of application No. 09/406,921, filed on Sep. 28, 1999, now abandoned, which is a continuation of application No. 08/788,831, filed on Jan. 27, 1997, now Pat. No. 5,974,560, which is a continuation of application No. 08/279,887, filed on Jul. 26, 1994, now Pat. No. 5,640,547, which is a division of application No. 07/872,174, filed on Apr. 22, 1992, now Pat. No. 5,388,249, which is a continuation of application No. 07/184,782, filed on Apr. 22, 1988, now Pat. No. 5,133,064.

(30) Foreign Application Priority Data

Apr. 27, 1987 (JP) .......................................... 62-101930
Jul. 22, 1987 (JP) .......................................... 62-181060

(51) Int. Cl.$^7$ ................................................ G06F 1/04
(52) U.S. Cl. ........................ 713/500; 713/501; 713/600
(58) Field of Search ................................ 713/400, 401, 713/500, 501, 503, 600; 714/25, 34, 724

(56) References Cited

U.S. PATENT DOCUMENTS 3,758,720 A    9/1973   Dinn .......................... 307/269
3,829,790 A    8/1974   Macrander .................... 331/61

(List continued on next page.)

FOREIGN PATENT DOCUMENTS

EP             0113516         7/1984

OTHER PUBLICATIONS

Kazuo Kato, et al, "A Low–Power 128 MHZ VCO for Monolithic PL L IC's" IEEE Journal of Solid State Circuits, 1988, vol. 23, No. 2, pp. 474–479.

Deog–Kyoun–Jeong, "Design of PLL–Based Clock Generation Circuits", IEEE Journal of Solid State Circuits, Apr. 1987, vol. SC–22, No. 2, pp. 255–261.

(List continued on next page.)

Primary Examiner—Dennis M. Butler
(74) Attorney, Agent, or Firm—Antonelli, Terry, Stout & Kraus, LLP

(57) ABSTRACT

An information processing system having an original clock oscillator for delivering at least one original clock signal K defined as a first clock signal and a plurality of information processing units supplied with the original clock signal K, wherein each information processing unit comprises clock generating means for generating at least one second clock signal $K_1$ which is phase-locked with the original clock signal K and which has a predetermined duty cycle and a logic device whose operation timing is controlled by the second clock signal $K_1$, And the operation timing of an interface provided between at least one pair of logic devices is synchronously controlled by the clock signal $K_1$.

9 Claims, 25 Drawing Sheets

U.S. PATENT DOCUMENTS

| | | | |
|---|---|---|---|
| 3,940,558 A | 2/1976 | Gabbard | 375/356 |
| 3,961,269 A | 6/1976 | Alvarez | 331/60 |
| 4,079,371 A | 3/1978 | Shimamura | 341/61 |
| 4,101,969 A | 7/1978 | Lawson et al. | 713/600 |
| 4,468,634 A | 8/1984 | Takagi | 331/60 |
| 4,486,850 A | 12/1984 | Hyatt | 364/747 |
| 4,494,196 A | 1/1985 | Greer | 64/236.2 |
| 4,504,745 A | 3/1985 | Spence | 307/270 |
| 4,519,071 A | 5/1985 | Miller | 370/105.3 |
| 4,521,893 A | 6/1985 | Bellman | 331/60 |
| 4,590,439 A | 5/1986 | Goggin | 331/60 |
| 4,630,193 A | 12/1986 | Kris | 364/200 |
| 4,639,856 A | 1/1987 | Hristich | 395/575 |
| 4,644,498 A | 2/1987 | Bedard | 364/900 |
| 4,661,721 A | 4/1987 | Ushiku | 307/269 |
| 4,673,891 A | 6/1987 | Remy | 331/2 |
| 4,677,394 A | 6/1987 | Vollmer | 331/1 A |
| 4,680,779 A | 7/1987 | Wakerly | 375/356 |
| 4,689,581 A | 8/1987 | Talbot | 331/1 A |
| 4,692,932 A | 9/1987 | Denhez | 375/356 |
| 4,719,593 A | 1/1988 | Threewitt et al. | 713/500 |
| 4,754,164 A | 6/1988 | Flora | 307/269 |
| 4,761,565 A | 8/1988 | Kannegundla | 307/243 |
| 4,774,686 A | 9/1988 | McClary | 364/736 |
| 4,779,008 A | 10/1988 | Kessels | 331/1 A |
| 4,823,262 A | 4/1989 | Calle | 395/550 |
| 4,827,401 A | 5/1989 | Hristich | 395/550 |
| 4,829,545 A | 5/1989 | Guzik | 331/1 A |
| 4,847,516 A | 7/1989 | Fujita | 307/269 |
| 4,862,104 A | 8/1989 | Muratani | 331/1 A |
| 4,864,253 A | 9/1989 | Zwack | 331/1 A |
| 4,890,222 A | 12/1989 | Kirk | 395/550 |
| 4,893,271 A | 1/1990 | Davis | 364/900 |
| 4,906,944 A | 3/1990 | Frerking | 31/1 A |
| 4,958,092 A | 9/1990 | Tanaka | 307/480 |
| 5,095,425 A | 3/1992 | Hesse | 395/550 |
| 5,133,064 A * | 7/1992 | Hotta et al. | 395/550 |
| 5,451,892 A | 9/1995 | Bailey | 327/113 |

OTHER PUBLICATIONS

"A Synchronous Approach for Clocking VLSI Systems", IEEE Journal of Solid State Circuits, Feb. 1982, vol. SC–17, No. 1, pp. 51–56.

"A 130 k–Gate CMOS Mainframe Chip Sets", ISSCC, Session VIII, pp. 86–87.

"A ISMIPS 326 Mircroprocessors", ISSCC, Session II, 1987, p p. 26–27.

"A Low–Power 128–MHz VCO f or Monolithic PL L IC's", K. Kato, IEEE Journal of Solid–State Circuits, vol. 23, No. 2, Apr. 1988, pp. 474–479.

* cited by examiner

|   | 1101 | 1309 | 3305 | 3306 | 3307 | 3308 | 3309 | 3310 | 3311 | 3312 | 3313 | 3314 | 3315 | P | D |
|---|------|------|------|------|------|------|------|------|------|------|------|------|------|---|---|
| a | 1 | 1 | 0 | 1 | 1 | 0 | 1 | 1 | 0 | 1 | 1 | 0 | 1 | 0 | 0 |
| b | 1 | 0 | 0 | 1 | 1 | 0 | 1 | 1 | 1 | 0 | 1 | 1 | 0 | 0 | 0 |
| c | 1 | 0 | 0 | 1 | 0 | 1 | 0 | 1 | 1 | 0 | 1 | 1 | 0 | 1 | 0 |
| d | 0 | 1 | 1 | 0 | 1 | 1 | 0 | 1 | 0 | 1 | 1 | 0 | 1 | 0 | 0 |
| e | 0 | 1 | 1 | 0 | 1 | 1 | 0 | 1 | 0 | 1 | 0 | 1 | 0 | 0 | 1 |
| f | 0 | 0 | 1 | 0 | 1 | 1 | 0 | 1 | 1 | 0 | 1 | 1 | 0 | 0 | 0 |
| g | 0 | 0 | 1 | 1 | 0 | 1 | 0 | 1 | 1 | 0 | 1 | 1 | 0 | 1 | 0 |
| h | 0 | 0 | 1 | 0 | 1 | 1 | 0 | 1 | 1 | 1 | 0 | 1 | 0 | 0 | 1 |

FIG. 45
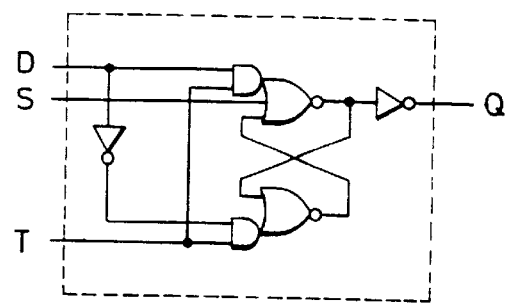
FIG. 46
| D | S | T | Q |
|---|---|---|---|
| 0 | 0 | 0 | Q |
| 1 | 0 | 0 | Q |
| 0 | 1 | 0 | 1 |
| 1 | 1 | 0 | 1 |
| 0 | 0 | 1 | 0 |
| 1 | 0 | 1 | 1 |
| 0 | 1 | 1 | 1 |
| 1 | 1 | 1 | 1 |
FIG. 47
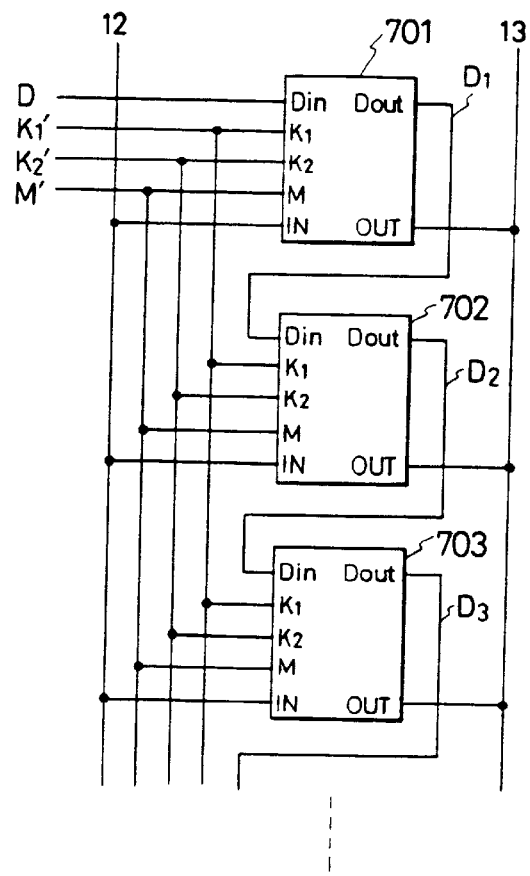

UNDETERMINED

DATA PROCESSING SYSTEM GENERATING CLOCK SIGNAL FROM AN INPUT CLOCK, PHASE LOCKED TO THE INPUT CLOCK AND USED FOR CLOCKING LOGIC DEVICES

This application is a continuation of application Ser. No. 09/406,921, filed Sep. 28, 1999 now abandoned; which is a continuation of application Ser. No. 08/788,831, filed Jan. 27, 1997, now U.S. Pat. No. 5,974,560; which is a continuation of Ser. No. 08/279,887, filed Jul. 26, 1994, now U.S. Pat. No. 5,640,547; which is a divisional of Ser. No. 07/872,174, filed Apr. 22, 1992, now U.S. Pat. No. 5,388,249; which is a continuation of Ser. No. 07/184,782, filed Apr. 22, 1988, now U.S. Pat. No. 5,133,064; and is related to application Ser. No. 08/278,245, filed Jul. 21, 1994, now U.S. Pat. No. 5,506,982; and application Ser. No. 08/460,601, filed Jun. 2, 1995, now U.S. Pat. No. 5,542,083.

BACKGROUND OF THE INVENTION

The present invention relates to an information processor and an information processing system which are controlled by clock signals. More particularly, the present invention pertains to an information processor and an information processing system which are suitable for reducing the clock cycle in order to achieve a high-speed information processing operation.

A first type of conventional information processor controlled by a clock signal is shown in FIG. 2. The reference numeral 201 denotes a clock oscillator which delivers an original clock signal, while the numeral 202 denotes a clock generator which receives the original clock signal 211 and generates clock signals 212 required to control logic devices 203 to 206. The reference numeral 213 denotes means for interfacing the logic devices which are controlled by the clocks 212 so as to operate in timed relation to each other.

As the clocks 212 used to control logic devices, it is common practice to employ multi-phase clocks, generally two- or four-phase clocks, which are different in phase from each other. Examples of multi-phase clocks are shown in FIGS. 4 to 6. FIG. 4 shows so-called non-overlap two-phase clocks which have respective time intervals $t_1$ and $t_2$ during which both of the clocks are at a low level. FIG. 5 shows overlap clocks having a duty cycle of 50% which are substantially 90° out of phase with each other. FIG. 6 shows four-phase clocks having a relatively short pulse width which are substantially 90° out of phase with each other. These clocks are selected in accordance with the form of the logic circuit that constitutes each individual logic device, or with the logic device designing method.

These multi-phase clock signals are generated in the clock generator 202 on the basis of the clock 211 and distributed to the logic devices. No processing of clock signals is carried out in the logic devices. Exchange of data between the logic devices is effected synchronously with the clock signal 211.

The first problem of this prior art approach is that the multi-phase clock signals 212 must be distributed throughout the information processor. For this reason, the clock skew is usually increased, and the duty cycle of each clock signal is offset from the desired value. This problem is particularly serious when the machine cycle is improved, or reduced, in order to achieve a high-speed information processing operation and the frequency of the multi-phase clock signals 212 is raised. In other words, the greater part of the machine cycle must be spared for the clock skew. On the other hand, the advantage of this prior art approach is that, since one set of multiphase clock signals 212 are distributed throughout the information processor, exchange of data between the logic devices can be effected synchronously.

FIG. 3 shows a second type of conventional information processor that employs a clock signal. The reference numerals 301, 302 respectively denote clock oscillators, 311, 312 original clock signals, 303, 304 information processing units controlled by the clock signals 311, 312, respectively, and 313 an interface employed between the information processing units 303 and 304. This information processor comprises two information processing units which have their respective clock oscillators 301 and 302. A clock generator which processes an original clock signal to generate multi-phase clock signals such as those shown in FIGS. 4 to 6 is provided inside each information processing unit. Exchange of data between the information processing units 303 and 304 is effected asynchronously through the interface 313.

The arrangement of the second prior art approach is often found in microprocessor systems or the like. Each information processing unit corresponds to an LSI chip. The first problem of this prior art approach is that, since the two information processing units are controlled by two different clock signals, the information processing units must be interfaced asynchronously. An asynchronous interface needs to synchronize asynchronous signals and is therefore lower in speed than a synchronous interface. This problem is particularly serious when it is desired to produce a high-speed system in which exchange of data between information processing units is effected a great deal. However, this prior art approach has the advantage that the generation of clock signals is effected inside each information processing unit and, since the clock signals are distributed within one information processing unit, the clock skew can be minimized.

The second problem of this prior art approach is that it is necessary to supply a high-frequency original clock signal from the outside of each information processing unit in order to generate clock signals having a correct duty cycle, it is general practice to frequency-divide an original clock signal inside an information processing unit. Therefore, in the case where the input frequency is halved and the machine cycle is 40 MHz, an original clock signal of 80 MHz must be supplied externally. If a packaged LSI chip is considered to be used as a piece of hardware constituting an information processing unit, it is difficult to supply such an original clock signal from the outside. As the machine cycle is reduced, this problem becomes increasingly serious.

FIGS. 7 to 9 show in combination a third type of conventional information processor controlled by a clock signal. This system is discussed in "Asynchronous Approach for Clocking VLSI Systems" (IEEE Journal of Solid-State Circuits Vol. SC-17, pp. 51 56).

FIG. 7 shows the general arrangement of the prior art approach. The reference numeral 701 denotes an oscillator for delivering a clock signal 711, and 702 a frequency divider which divides the frequency of the clock signal 711 by N. Information processing units 703 and 704 are supplied with both clock signals 711 and 712. The numeral 713 denotes an interface circuit provided between the processing units 703 and 704.

FIG. 8 shows the internal arrangement of the information processing unit 703. The reference numeral 801 denotes a PLL (Phase Lock Loop) circuit which delays the clock signal 711 so that it is in a specific phase relation with the clock signal 712. The PLL circuit 801 delivers a clock signal 811 for controlling a logic device 802. On the other hand, the clock signal 712 is a clock obtained by dividing the frequency of the clock 711 by N, as described above, and it is employed to control an interface circuit 803. More specifically, the logic device inside the information processing unit is controlled by the high-speed clock signal 711, while the communication between the information processing units in which it takes a relatively long time to effect signal propagation is controlled by the low-speed clock 712.

In the case where two different kinds of clock signal are employed, exchange of data between the interface circuit 803 and the logic device 802 involves a problem which is known as metastability. This problem will be explained with reference to FIG. 9. Let us consider the case where data is delivered from the interface circuit 803 to the logic device 802. It is assumed that an edge trigger type flip-flop is used to constitute an interface 713. In the interface circuit 803, when the clock signal 712 rises from a low level, which is a first potential level, to a high level, which is a second potential level, data is taken in from the interface 713 and delivered to the logic device 802 through a signal bus 812. In the logic device 802, when the clock signal 811 rises from a low level to 4 high level, the data delivered is taken in. If the phase relationship between the clock signals 712 and 811 is shifted due to a skew such that the rise of the clock 712 overlaps the vicinity of the rise of the clock 811 (i.e., the portion denoted by the reference symbol $t_c$ in FIG. 9), the input of the flip-flop in the logic device is unstable when it is hit by the clock signal 811, resulting in the phenomenon that no output is determined in the flip-flop for a long period of time. This phenomenon is called metastability.

In order to avoid the above-described metastability, in this prior art, the PLL circuit 801 is inserted as shown in FIG. 8 to fix the phase relationship between the clock signals 711 and 712 as shown. in FIG. 9.

The first problem of the third prior art approach is that the high-speed clock signal 711 must be supplied from the outside of the information processing unit. The second problem is that no consideration is given to the clock duty cycle used inside the information processing unit.

A fourth type of conventional information processor controlled by a clock signal, that is, "A 130 K-Gate CMOS Maintrame Chip Set" ISSCC 87, SESSION VIII, pp. 86–87, 1987, which is a semiconductor integrated circuit device having logic circuits controlled by clock signals, is shown in FIG. 42.

In FIG. 42, the reference numeral 1 denotes a semiconductor integrated circuit device, 2 a pad, 3 an input buffer, 201 to 203 first-stage clock buffers, 211 to 219 second-stage clock buffers, and 221 to 226 logic circuit blocks controlled by clock signals.

An external clock signal 10 input to the pad 2 is formed into an internal clock signal 11 through the input buffer 3. The clock signal 11 is distributed by the first-stage clock buffers 201 to 203 in the form of clock signals 231 to 233, and these signals are further distributed by the second-stage clock buffers 211 to 219 in the form of clock signals 241 to 249 to control the logic circuit blocks 221 to 226.

In the fourth prior art approach, logic circuit blocks which are present throughout a semiconductor integrated circuit device and which are controlled by clock signals are divided into a plurality of blocks and a clock buffer is provided for each of the divided logic circuit blocks to supply a clock signal thereto, thereby enabling a reduction in the load which is driven by each clock buffer. Accordingly, it is possible to reduce the delay in signal transmission from the reception of the external clock signal to the generation of the clock signal for controlling each internal logic circuit.

In the fourth prior art, logic circuit blocks on a semiconductor integrated circuit are divided into a plurality of blocks and a clock buffer is provided for each of the divided logic circuit blocks, as described above. More specifically, in the arrangement shown in FIG. 42, the clock signals 241 and 248 which control the logic circuit blocks 221 and 226, respectively, are formed from the internal clock signal 11 through the buffers 201, 211 and 203, 218, respectively. Thus, the clock signals for controlling the logic circuit blocks are supplied from the respective buffers which are different from each other, and therefore variations in delay time among the buffers due to the difference in driving capacity between the buffers, variations in load to be driven thereby, and variations in production of elements constituting the buffers result in a clock skew. An excessive clock skew may cause errors in exchange of signals between the logic circuit blocks.

A fifth type of conventional information processor controlled by a clock signal, that is, "A 15MIPS 32b Microprocessor" ISSCC 87, SESSION II, pp. 26–27, 1987, which is a semiconductor integrated circuit device having logic circuits controlled by clock signals, is shown in FIG. 43.

In FIG. 43, the same elements or portions as those in FIG. 42 are denoted by the same reference numerals. The numeral 4 denotes a clock internal buffer, 301 a clock driver, and 311 to 318 logic circuit blocks controlled by clock signals.

The external clock signal 10 input to the pad 2 is formed into an internal clock signal 11 through the input buffer 3. The clock signal 11 is formed into a clock signal 321 through the clock internal buffer 4 and then input to the clock driver 301, from which clock signals 322 are supplied to the logic circuit blocks 311 to 318 through a net-like signal wiring 322 laid throughout the semiconductor integrated circuit device to control the logic circuit blocks 311 to 318.

In the fifth prior art approach, all the logic circuit blocks which are present throughout the semiconductor integrated circuit device and which are controlled by clock signals are supplied with clock signals from a single clock driver. Therefore, it is possible to eliminate the phase shift, that is, skew, of the clock signals among the logic circuit blocks and hence eliminate errors in exchange of signals (data and information) between the logic circuit blocks.

In the fifth prior art approach, however, clock signals for controlling all the logic circuit blocks on the semiconductor integrated circuit device are supplied from a single clock driver as described above. Therefore, the clock driver 301 must drive a load of about 200 to 300 pF which consists of the net-like signal wiring 322 laid throughout the semiconductor integrated circuit device and the logic circuit blocks 311 to 318 as objects of control. Accordingly, the delay in activation of the clock driver 301 is increased. In addition, since the time required for the clock signal 322 to rise or fall is also increased, the current flowing through the logic circuits in the logic circuit blocks 311 to 318 which are activated in response to the clock signal 322 is increased, disadvantageously. Even if the driving capacity of the clock driver 301 is increased, the above-described problems cannot be solved because, if the high load (200 to 300 pF) is driven at high speed, a large noise is generated in power supply and grounding lines around the clock driver 301, causing a mal-operation.

SUMMARY OF THE INVENTION

It is a first object of the present invention to synchronize clock signals among a plurality of information processing units inside an information processor.

It is a second object of the present invention to supply each information processing unit with a clock signal having a minimized clock skew and a precise duty cycle.

It is a third object of the present invention to avoid the supply of a high-speed clock signal from the outside of an information processing unit.

It is a fourth object of the present invention to reduce the clock, skew, the clock delay time and the clock rise and fall time inside semiconductor integrated circuit devices having logic circuits controlled by clock signals.

It is a fifth object of the present invention to provide a clock driver which is capable of coping with the need for high-speed and high-frequency clock signals.

One feature of the present invention resides in an information processing system having an original clock oscillator for delivering at least one original clock signal K defined as a first clock signal and a plurality of information processing units supplied with the original clock signal $K_1$, wherein each of the information processing units comprises a clock generating means for generating at least one second clock signal $K_1$, which is phase-locked with the original clock signal K and which has a predetermined duty cycle and a logic device whose operation timing is controlled by the second clock signal $K_1$, and the operation timing of an interface provided between at least one pair of logic devices is synchronously controlled by the clock signal $K_1$.

The clock signal $K_1$, that is generated inside each information processing unit is phase-locked with the original clock signal K. Accordingly, the clock signal $K_1$, inside a certain information processing unit can be phase-locked with the clock signal $K_1$ inside another information processing unit through the original clock signal K.

Since each information processing unit incorporates a clock generating means for generating at least one second clock signal $K_1$, which is phase-locked with the original clock signal K and which has a predetermined duty cycle, it is possible to supply an internal element of each information processing unit with a clock signal having a minimized clock skew and a precise duty cycle.

Although the clock generating means phase-locks the original clock signal K and the internal clock signal $K_1$, the frequency of the original clock K is not required to be equal to nor higher than the frequency of the internal clock signal $K_1$. Accordingly, it is possible to avoid the supply of a high-speed clock signal from the outside of each information processing unit in an information processor consisting of a plurality of information processing units in which the frequency of the internal clock signal $K_1$ is raised in order to achieve a high-speed operation.

Another feature of the present invention resides in an information processor having logic circuits controlled by clock signals, wherein a parallel circuit of tri-state circuits is used as a clock driver circuit for supplying the clock signals. More specifically, all the logic circuits which are controlled by clock signals are supplied with the clock signals which are output from the parallel circuit of tri-state circuits, and the tri-state circuits are disposed at the peripheral portion of the information processor. Further, the information processor has a tri-state control circuit arranged such that, when a diagnostic operation is conducted, the control circuit activates only one of the tri-state circuits constituting the parallel circuit and places the other tri-state circuits in a high-impedance state, whereas, when the information processor is operative in any mode other than the diagnostic mode, the control circuit allows all the tri-state circuits to be activated.

Since all the logic circuits in the information processor which are controlled by clock signals are supplied with clock signals which are output from a parallel circuit of tri-state circuits, it is possible to eliminate the skew of clock signals among the logic circuits. Further, when a diagnostic operation is conducted, the tri-state control circuit activates only one of the tri-state circuits constituting the parallel circuit and places the other tri-state circuits in a high-impedance state, and it is therefore possible to check the operation of any one of the tri-state circuits of the parallel circuit. Accordingly, it is possible to check the operation of all the tri-state circuits. Thus, since all the logic circuits in the information processor are supplied with clock signals by means of the parallel circuit of tri-state circuits, the load which needs to be driven by each of the tri-state circuits is minimized, and it is therefore possible to reduce the delay time and shorten the rise and fall time of the clock signals. Since the tri-state circuits constituting the parallel circuit are disposed at the peripheral portion of a semiconductor integrated circuit device formed by fabricating the information processor on a single semiconductor substrate, the noise generated in power supply and grounding lines when the tri-state circuits supply clock signals is dispersed throughout the semiconductor integrated circuit device, and therefore no-mal-function of the logic circuits occurs.

Thus, since it is possible to minimize the clock skew, reduce the delay time of clock signals and shorten the clock rise and fall time in an information processor having logic circuits controlled by clock signals, it is possible to reduce the time margin for prevention of a malfunction due to clock signals in the information processor and hence raise the frequency of the external clock signal.

The above and other objects, features and advantages of the present invention will become apparent from the following description of the preferred embodiments thereof taken in conjunction with the accompanying drawings.

BRIEF DESCRIPTION OF THE DRAWINGS

FIGS. 44, 45 and 47 show in detail the arrangement of the embodiment shown in FIG. 41;

FIG. 46 is a chart showing various states of the arrangement shown in FIG. 45;

DETAILED DESCRIPTION OF THE EMBODIMENTS

One embodiment of the present invention will be described hereinunder.

Figure 10:
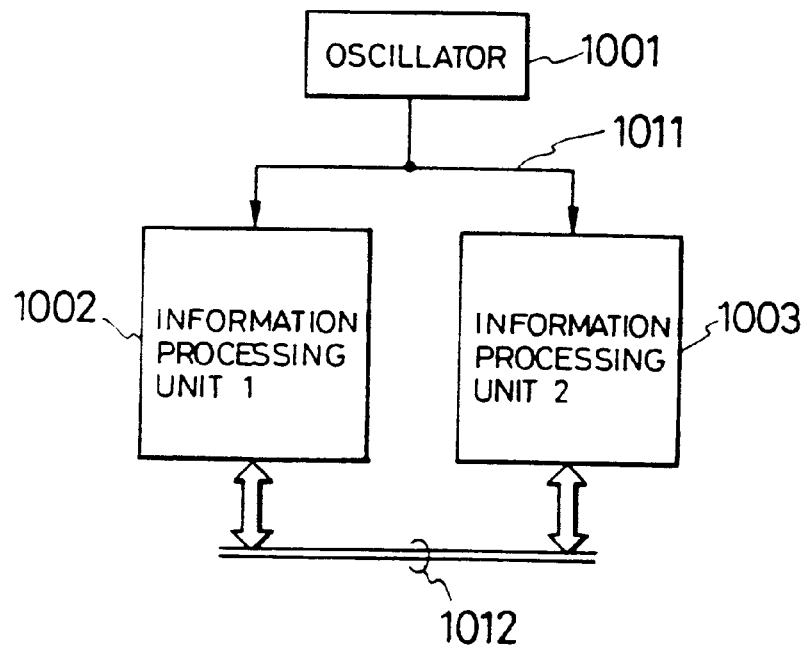
FIGS. 10 and 11 are block diagrams showing the general arrangement of one embodiment of the present invention.

FIG. 10 shows the general arrangement of an information processor in accordance with one embodiment of the present invention. The reference numeral 1001 denotes an original clock oscillator, 1011 an original clock, 1002, 1003 information processing units, and 1012 an interface used to exchange data between the information processing units.

Although there may be various kinds of information processor to which the present invention may be applied, in this embodiment a computer CPU which comprises an ultraspeed VLSI will be taken by way of example to describe the present invention. Although an information processor generally consists of a plurality of information processing units, the information processor in this embodiment is assumed to be composed of two information processing units for simplification.

An information processing unit is composed of elements which are combined together in terms of logical function and hardware so as to constitute a part of an information processor. As a hardware structure, one information processing unit may be a board having a plurality of LSI packages mounted thereon, or may be formed on a single semiconductor substrate, that is, one LSI, or may be a part of one LSI. In the case of wafer-scale integration, one information processing unit may be one block on a wader defined by a single semiconductor substrate. It is assumed in this embodiment that an information processing unit is a single packaged VLSI.

Figure 34:
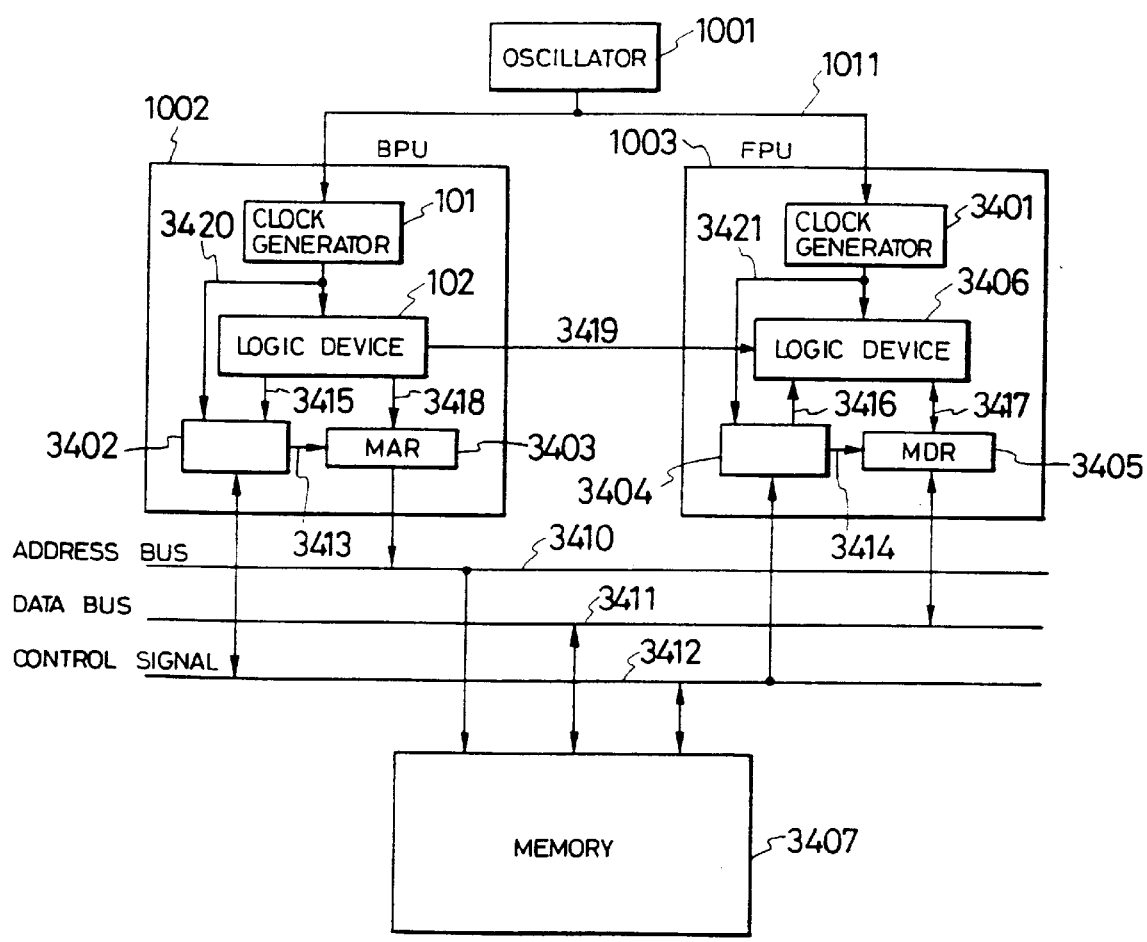

In regard to this embodiment of the present invention, description of only the interface used between the information processing units 1002 and 1003 will suffice, and the present invention is not directly concerned with the kind of processing assigned to the information processing units. Therefore, detailed description thereof is omitted, and the following two cases are exemplarily shown: 1) FIG. 34 shows one example of the arrangement in which the information processing unit 1002 is defined as a BPU (Basic Processing Unit) which performs decoding of commands and processing of basic commands, while the information processing unit 1003 is defined as an FPU (Floating Processing Unit) which executes floating-point arithmetic. The reference numerals 101 and 3401 denote clock generators in the information processing units 1002 and 1003, respectively. The numerals 102, 3406 denote logic devices, respectively, each of which subjects an input signal to a desired logical operation to output an output signal, 3402, 3404 bus controllers constituting interface means, 3403 a register MAR (Memory Address Register) which holds a memory address, 3405 a register MDR (Memory Data Register) which holds memory data, and 3407 a memory. The numeral 3410 denotes an address bus, 3411 a data bus, and 3412 a control signal bus. The numeral 3419 denotes a signal line which informs the logic device 3406 of the kind of command for floating-point arithmetic which is to be processed.

In this example, the logic device in the FPU 1003 has no address computation function and functions as a so-called co-processor. The operation of the illustrated arrangement will next be explained in regard to loading of floating-point data to the FPU from the memory by way of example. The logic device 102 in the BPU 1002 decodes a floating-point arithmetic command and delivers the kind of command to the FPU 1003 through the signal 3419. On the other hand, the logic device 102 computes and sets a memory address in the MAR 3403 through a signal 3418. Further, the logic device 102 delivers a memory read start command to the bus controller 3402 through a signal 3415. In synchronism with a clock 3420, the bus controller 3402 controls the MAR 3403 through a signal 3413 so that the content of the MAR 3403 is delivered to the address bus 3410. The bus controller 3402 further delivers the control signal 3412 for controlling the memory 3407.

On the other hand, the bus controller 3404 in the FPU 1003 receives the control signal 3412 and delivers a data read signal 3414 to the MDR 3405 at the timing at which the memory 3407 outputs data to the data bus 3411. After operand data has been input to the MDR 3405, the bus controller 3404 delivers an operand read end signal 3416 to the logic device 3406. The loaded operand data is delivered through a signal 3417.

2) in a second example, the information processing unit 1 is defined as a master BPU, while the information processing unit 2 is defined as a slave BPU. In other words, the information processing units 1 and 2 are employed to constitute a computer having a double BPU arrangement for the purpose of improving reliability. The slave BPU has the same function as that of the master BPU and operates synchronously with it. When the master BPU writes data into a memory, the slave BPU takes the data into its own chip to compare it with its own data. If these two data items are discordant with each other, the slave BPU informs the master BPU of the discordance.

Figure 29:
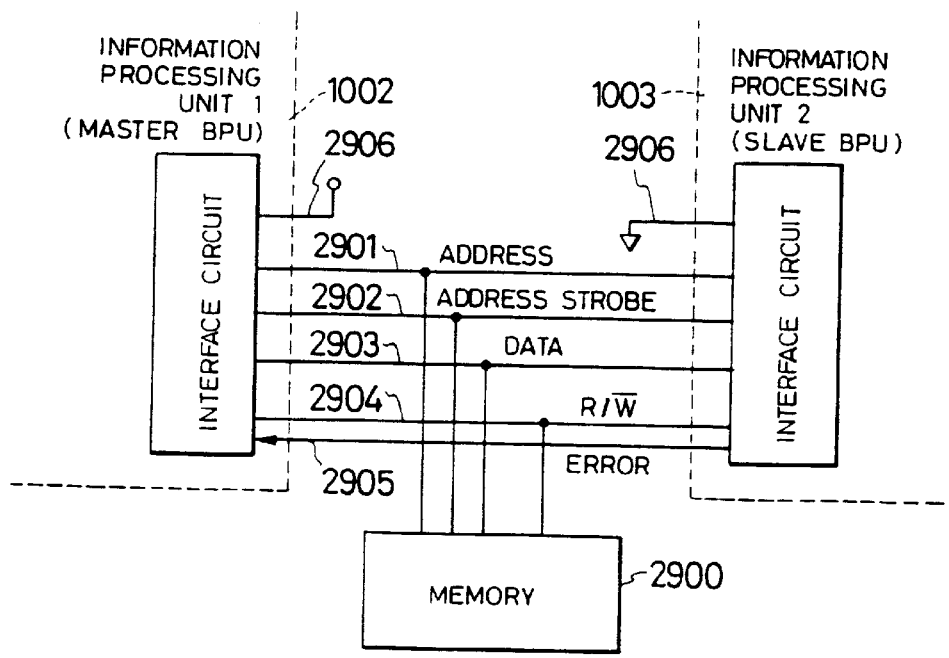
FIGS. 29 and 30 are views employed to describe the interface used between information processing units in one embodiment of the present invention.

FIG. 29 shows the above-described arrangement. The reference numeral 2900 denotes a memory. The numerals 2901 to 2905 denote interface signals, in which: 2901 denotes an address bus; 2902 denotes an address strobe signal; 2903 denotes a data bus; 2904 denotes a read/write signal; and 2905 denotes a signal used when the slave BPU informs the master BPU of an error. The numeral 2906 denotes a signal arranged such that, when it is at a high level, the information processing unit concerned is recognized to be the master, whereas, when the signal 2906 is at a low level, the information processing unit concerned is recognized to be the slave.

Figure 30:
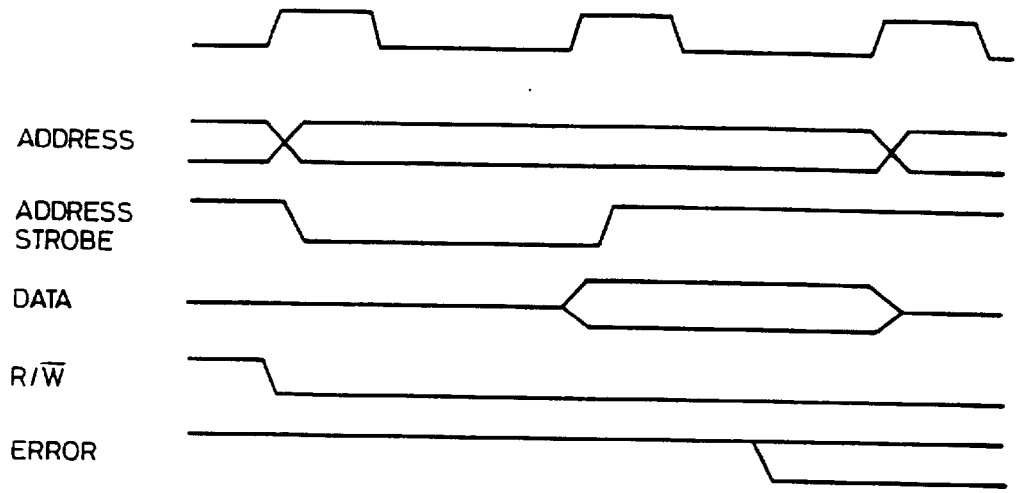

FIG. 30 is a timing chart showing the operation of the above-described embodiment. Since both the information processing units operates synchronously with each other, when the master BPU is writing data, the slave BPU also has a write address and write data. The memory cycle increases by an amount corresponding to the clock skew between the chips.

The oscillator 1001 will next be explained. The oscillator 1001 delivers an original clock signal 1011. The original clock signal 1011 may be a multi-phase signal, but, in this embodiment, it is a single-phase signal. The duty cycle of the original clock signal 1011 is not necessarily needed to be 50%, which is a characteristic feature of the present invention.

Figure 11:
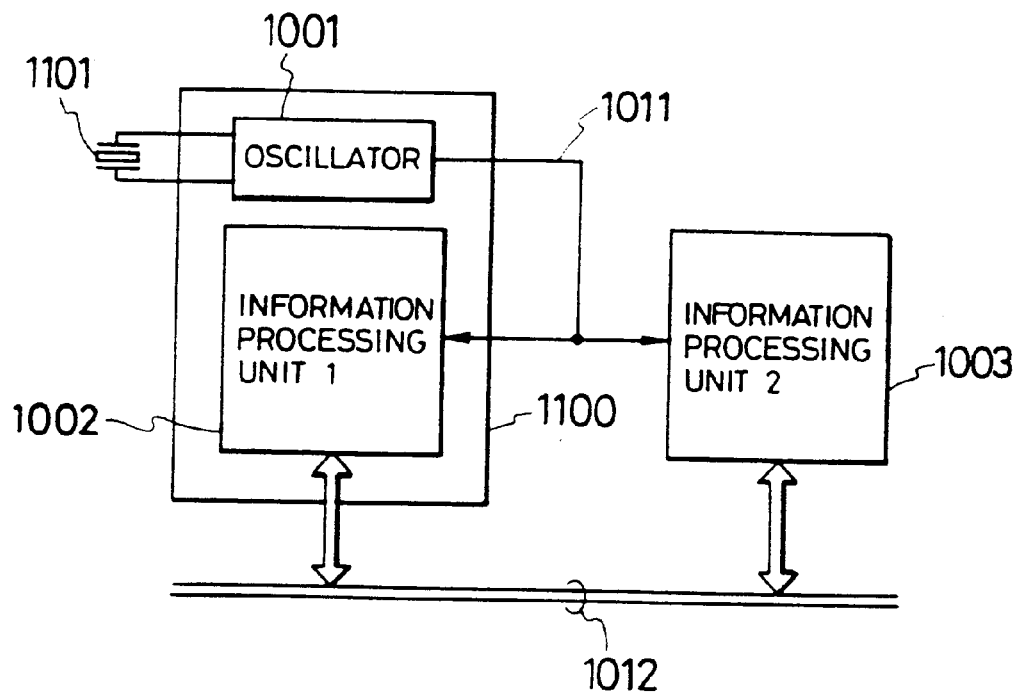

The oscillator 1001 may be incorporated in the information processing unit 1 for convenience. In such a case, the arrangement may be such as that shown in FIG. 11. The reference numeral 1100 denotes a VLSI chip having both the information processing unit 1002 and the oscillator 1001 on the same one semiconductor substrate. The numeral 1101 denotes a crystal oscillator. Since the chip 1100 itself also takes in the oscillator output 1011 which has once been output to the outside of the chip 1100, the relationship between the original clock signal and the information processing units 1, 2 is the same as that in the arrangement shown in FIG. 10. In the arrangement shown in FIG. 11, it is unnecessary to provide an external oscillator since the chip 1100 incorporates the oscillator 1001, and it is therefore advantageously possible to reduce the size of the hardware arrangement.

Figure 1:
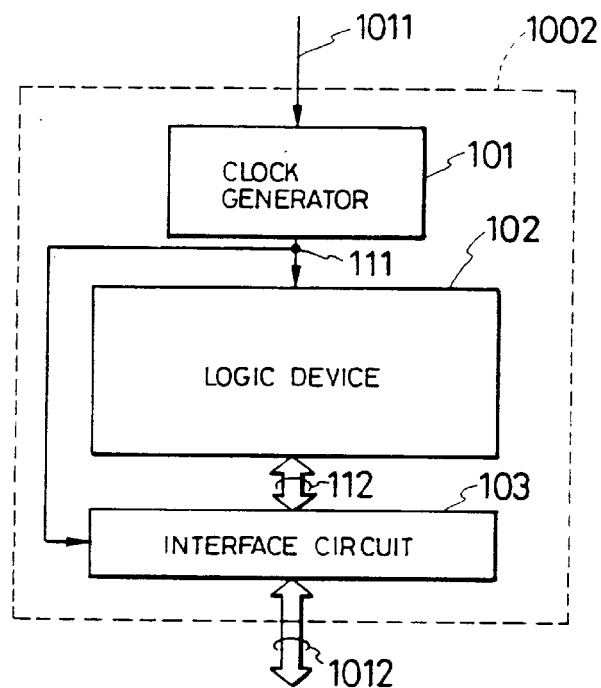
FIG. 1 is a block diagram of an information processing unit in one embodiment of the present invention.
Figure 2:
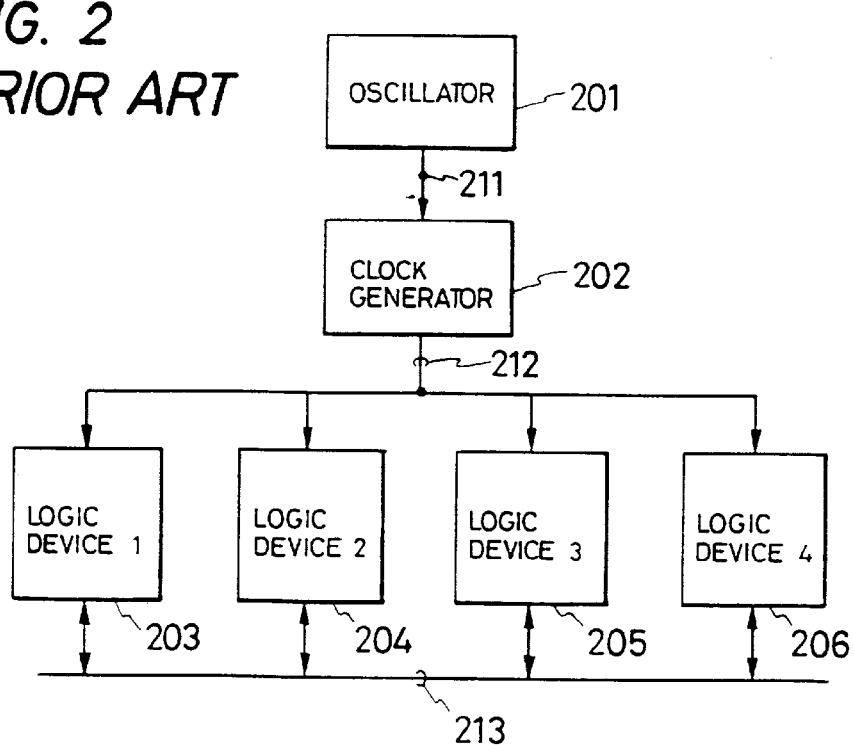
FIGS. 2 and 3 are block diagrams showing prior arts, respectively.
Figure 3:
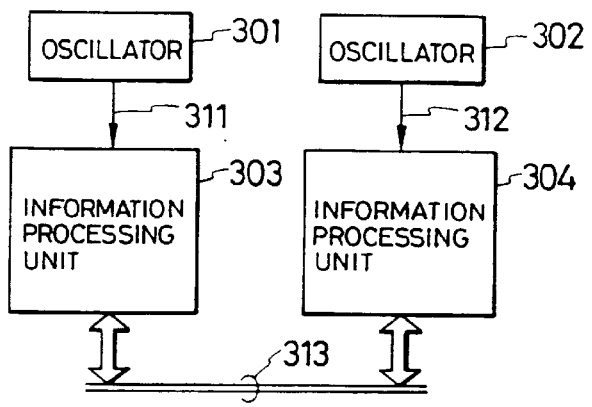
Figure 4:
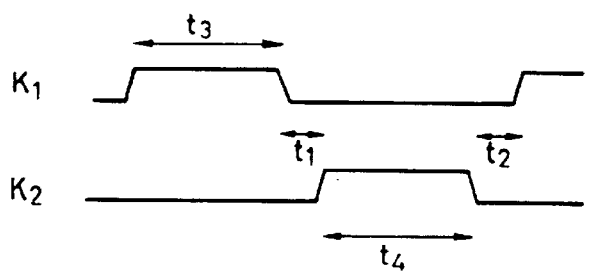
FIGS. 4 to 6 are timing charts employed to describe prior arts.
Figure 5:
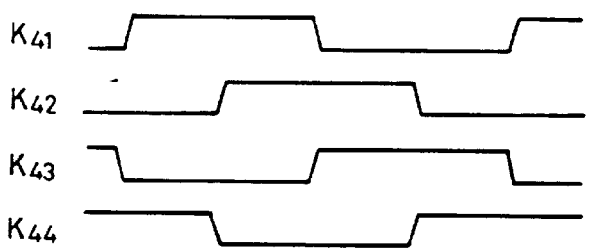
Figure 6:
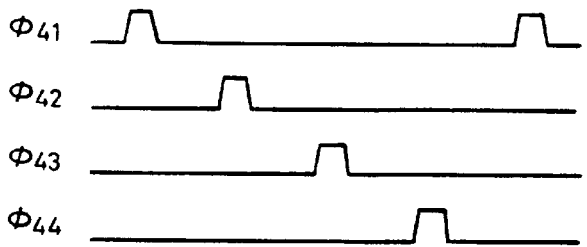
Figure 7:
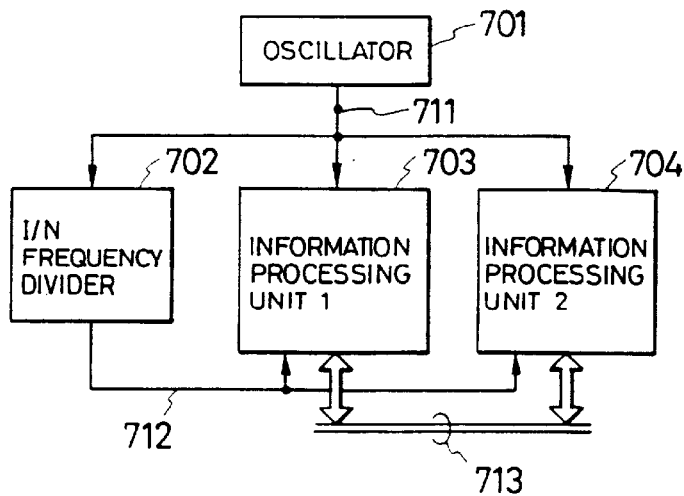
FIGS. 7 and 8 show in combination another prior art.
Figure 8:
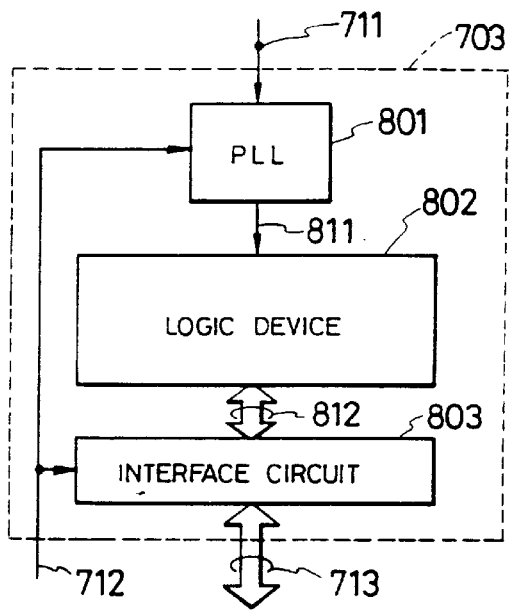
Figure 9:
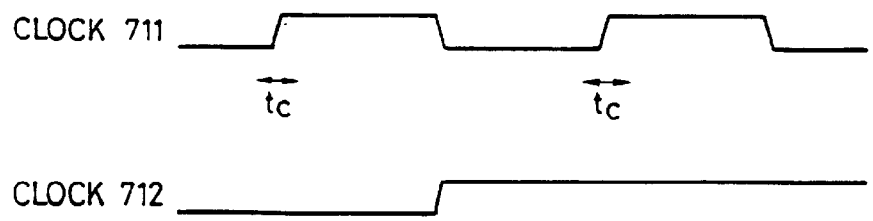
FIG. 9 is a timing chart employed to describe the prior art shown in FIGS. 7 and 8.

FIG. 1 shows the internal arrangement of the information processing unit 1002 shown in FIG. 10. The reference numeral 101 denotes a clock generator, 111 multi-phase clock signals, 102 a logic device, 103 an interface circuit, and 112 a signal bus provided between the logic device 102 and the interface circuit 103. The clock generator 101 generates multi-phase clock signals 111 including at least two, that is, second and third, clock signals on the basis of an external original clock signal 1011 and delivers the clock signals 111 to both the logic device 102 and the interface circuit 103. There are various kinds of multi-phase clock signal as shown in FIGS. 4 to 6. In this embodiment, the multi-phase clock signals 111 are assumed to be non-overlap two-phase clock signals $K_1$ and $K_2$ shown in FIG. 4.

The logic device 102 shown in FIG. 1 will next be explained. The logic device 102 is controlled by the two-phase clock signals $K_1$ and $K_2$. The logic device 102 may be constituted by various kinds of logic element including inverters, basic gates, for example, a two-input inverter NAND gate or the like, flip-flops, a programmable logic array (PLA), a ROM, a RAM, etc. A PLA will be taken by way of example to describe the way in which the clock signals $K_1$ and $K_2$ are used and what is required for the clock signals $K_1$ and $K_2$ when the machine cycle is reduced.

Figure 12:
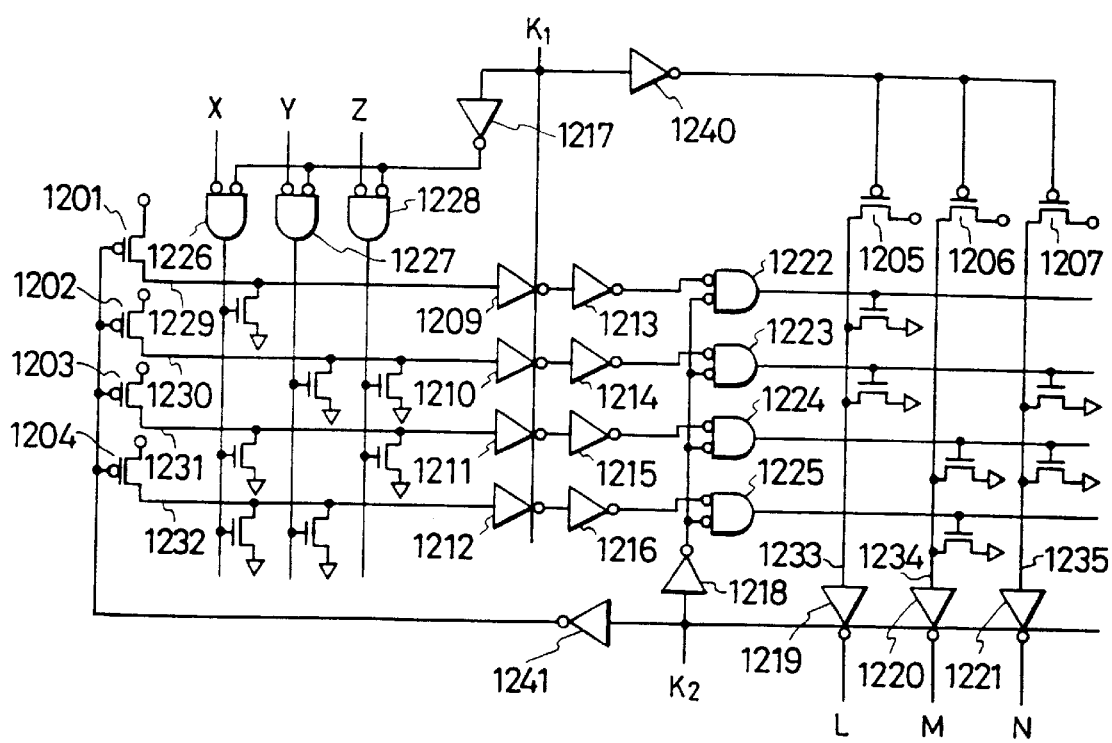
FIG. 12 shows the arrangement of a logic device in accordance with one embodiment of the present invention.
Figure 13:
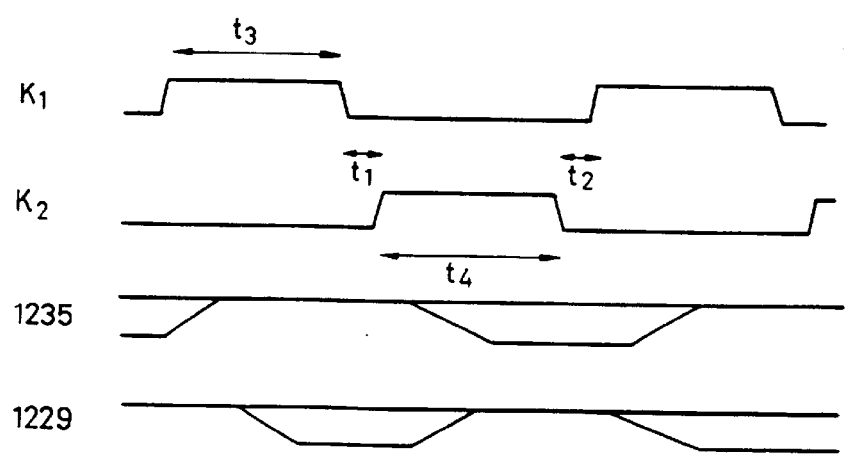
FIG. 13 is a timing chart showing the operation of the logic device shown in FIG. 12.

FIG. 12 is a circuit diagram of a PLA which is controlled by the two-phase clock signals $K_1$ and $K_2$ while FIG. 13 is a timing chart showing the operation of the PLA shown in FIG. 12.

Referring to FIG. 12, the reference numerals 1201 to 1207 denote PMOS transistors for precharging wirings 1229 to 1235, respectively, 1209 to 1212 and 1219 to 1221 clocked inverters, 1213 to 1218 and 1240, 1241 inverters, and 1222 to 1228 two-input NOR circuits. The reference symbols X, Y and Z denote inputs, while the symbols L, M an N denote outputs. This PLA realizes the following logical operations:

$L = X + Y \cdot Z$ $M = X \cdot Z + X \cdot Y$ $N = Y \cdot Z + X \cdot Z$

As shown in FIG. 13, when the clock signal $K_2$ is at a high level, the wiring 1229 is precharged, whereas, when the clock signal $K_1$ is at a high level and X=0, the wiring 1229 is discharged by an NMOS. On the other hand, when X=1, the wiring 1229 is not discharged. When X=0, the wiring 1229 must be discharged during the period when the clock signal $K_1$ is at the high level, that is, during the period $t_3$ shown in FIG. 13. When the clock system is designed, the period $t_3$ is set so that the discharge of the wiring 1229 is completed within the period $t_3$ even in the worst case, with consideration given to the fact that the period $t_3$ may be somewhat narrowed during distribution of clock signals.

On the other hand, the wiring 1235 is precharged when the clock signal $K_1$ is at the high level, and it is discharged when the clock signal $K_2$ is at the high level, that is, during the period $t_4$. In the same way as in the case of the period $t_3$, the period $t_4$ is also set so that the discharge of the wiring 1235 is completed within the period $t_4$ even in the worst case, with consideration given to the fact that the period $t_4$ may be somewhat narrowed during distribution of clock signals.

Since the periods $t_3$ and $t_4$ are used symmetrically as described above, these periods are set so as to be $t_3 = t_4$. As will be obvious from the foregoing description, it is important in order to reduce the machine cycle to minimize the fluctuation of the periods $t_3$ and $t_4$, that is, to keep the duty cycle of the clock signals $K_1$ and $K_2$ precise in the logic device 102 shown in FIG. 1.

The clock skew will next be explained. When the wiring 1229 in the arrangement shown in FIG. 12 is discharged, the output of the inverter 1213 changes from a high level to a low level. If this change has not been completed before the output of the inverter 1218 changes from a high level to a low level, the wiring 1233 may be erroneously discharged. Therefore, the period $t_1$ shown in FIG. 13 must be greater than a predetermined value. Accordingly, when the clock system is designed, $t_1$ is set so that the above-described mal-operation is not caused even in the worst case, with consideration given to the fact that the period $t_1$ may be somewhat narrowed during distribution of clock signals. The same is the case with the period $t_2$. As will be obvious from the foregoing description, it is important in order to reduce the machine cycle to minimize the fluctuation of the periods $t_1$ and $t_2$, that is, the clock skew of the signals $K_1$ and $K_2$.

To sum up, it is necessary in order to reduce the machine cycle of the logic device 102 controlled by the clock signals $K_1$ and $K_2$ to minimize the fluctuation of the duty cycle and the skew of the clock signals.

Figure 14:
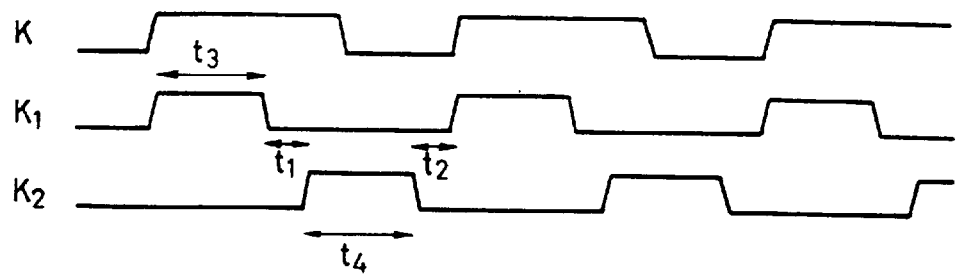
FIGS. 14 and 15 are timing charts showing the operation of a clock generator in one embodiment of the present invention.
Figure 15:
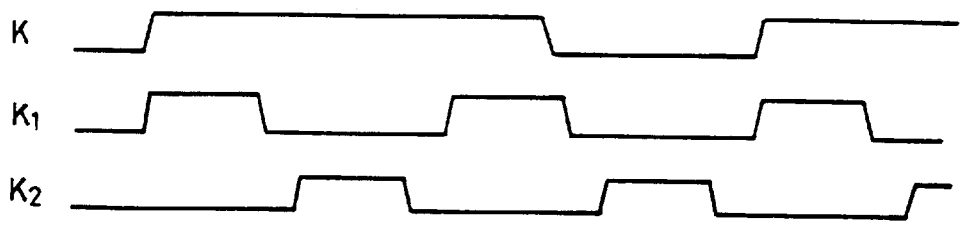

The clock generator 101 will next be explained. FIG. 14 shows the operation of the clock generator 101. The clock generator 101 receives an original clock signal K and outputs two-phase clock signals $K_1$ and $K_2$. The duty cycle of the original clock signal K does not necessarily need to be 50%. The clock signals $K_1$ and $K_2$ are phase-locked with the original clock signal K. The clock signals $K_1$ and $K_2$ are set so that $t_1 = t_2$ and $t_3 = t_4$, as described above. The term "phase lock" is herein employed to mean that the phase relationship between the original clock signal K and the clock signal $K_1$ is constant and, more specifically, the interval between the rise of the signal K and the rise of the signal $K_1$ is constant. In FIG. 14, the frequencies of the signals K and $K_1$, $K_2$ are equal to each other. However, the frequencies do not necessarily need to be equal to each other. FIG. 15 shows another example of the operation of the clock generator 101. The signals K and $K_1$ (also K and $K_2$) are phase-locked with each other, but the frequency of the signals $K_1$ and $K_2$ is twice that of the signal K. This arrangement is preferable because it becomes possible to maintain at a low frequency the clock signal supplied from the outside of the chip and eliminate the restriction concerning the duty cycle of the external clock signal while improving the machine cycle inside the chip.

It should be noted that the low level of the original clock signal K defined as a first clock signal is a first potential level, while the high level of the signal K is a second potential level, and the low level of the signals $K_1$ and $K_2$ defined as second and third clock signals, respectively, is a third potential level, while the high level of the signals $K_1$ and $K_2$ is a fourth potential level.

It is preferable that the first and third potential levels be substantially equal to each other, and the second and fourth potential levels be substantially equal to each other.

The arrangement of the clock generator 101 will be described hereinunder in detail.

Figure 16:
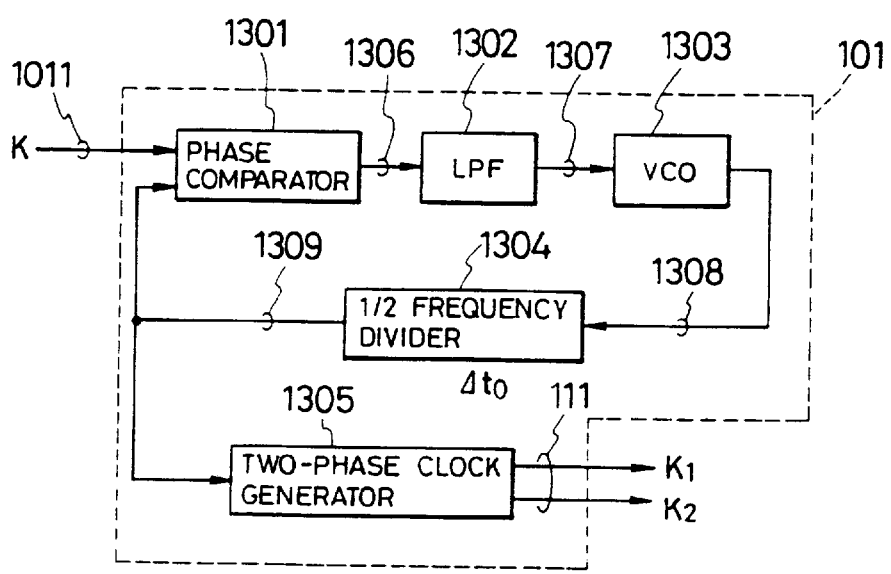
FIGS. 16 to 28 are block diagrams and timing charts employed to describe the clock generator in one embodiment of the present invention.

FIG. 16 shows one example of the arrangement of the clock generator 101 which receives a signal 1011 (the original clock signal K) and generates non-overlap two-phase clock signals $K_1$ and $K_2$ (corresponding to those shown in FIG. 14) which have the same frequency as that of the signal K and are phase-locked with it as well as having a predetermined duty cycle.

A PLL (Phase-Locked Loop circuitry) comprises a closed loop consisting of a phase comparator 1301, a low-pass filter (hereinafter referred to as "LPF") 1302, a voltage control oscillator (hereinafter referred to as "VCO") 1303 and a 1/N (e.g., ½) frequency divider 1304. More specifically, a phase difference and frequency difference between the signals 1011 and 1309 are detected in the phase comparator 1301, and a pulse signal 1306 corresponding to the detected differences is output from the comparator 1301 to the LPF 1302. The LPF 1302 integrates the signal 1306 to form and output a DC signal (voltage value) 1307 to the VCO 1303. The VCO 1303 oscillates at a frequency corresponding to the signal 1307 to output a signal 1308. The frequency divider 1304 halves the frequency of the signal 1308 to thereby output a clock signal 1309 having a duty cycle 50%. Accordingly, the clock signal 1309 is phase-locked with the original clock signal 1011 and allowed to have a frequency equal to that of the signal 1011 by the PLL. In addition, the clock signal 1309 has a duty cycle of 50% as a result of frequency division effected in the frequency divider 1304.

Figure 17:
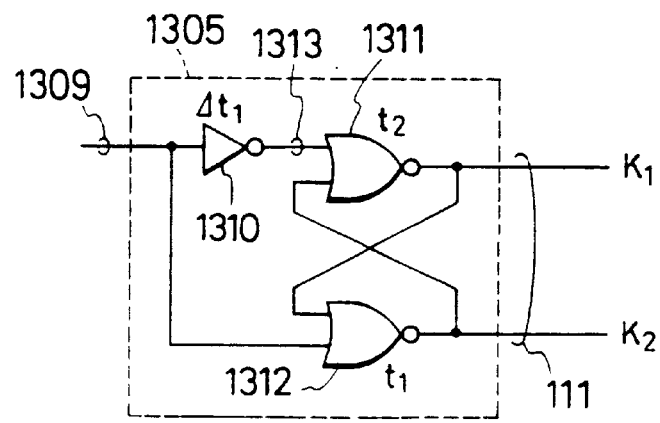

The two-phase clock generator 1305 receives the clock signal 1309 having a duty cycle of 50% and outputs non-overlap two-phase clock signals K and $K_2$. FIG. 17 shows one example of the gate-level arrangement of the two-phase clock generator 1305.

The outputs $K_1$ and $K_2$ of two-input NOR circuits 1311 and 1312 are cross-coupled to first inputs of the NOR circuits, and second inputs of the NOR circuits 1311 and 1312 are respectively supplied with complementary signals, that is, an inverted signal of the clock signal 1309 obtained through an inverter circuit 1310 and the clock signal 1309.

Figure 18:
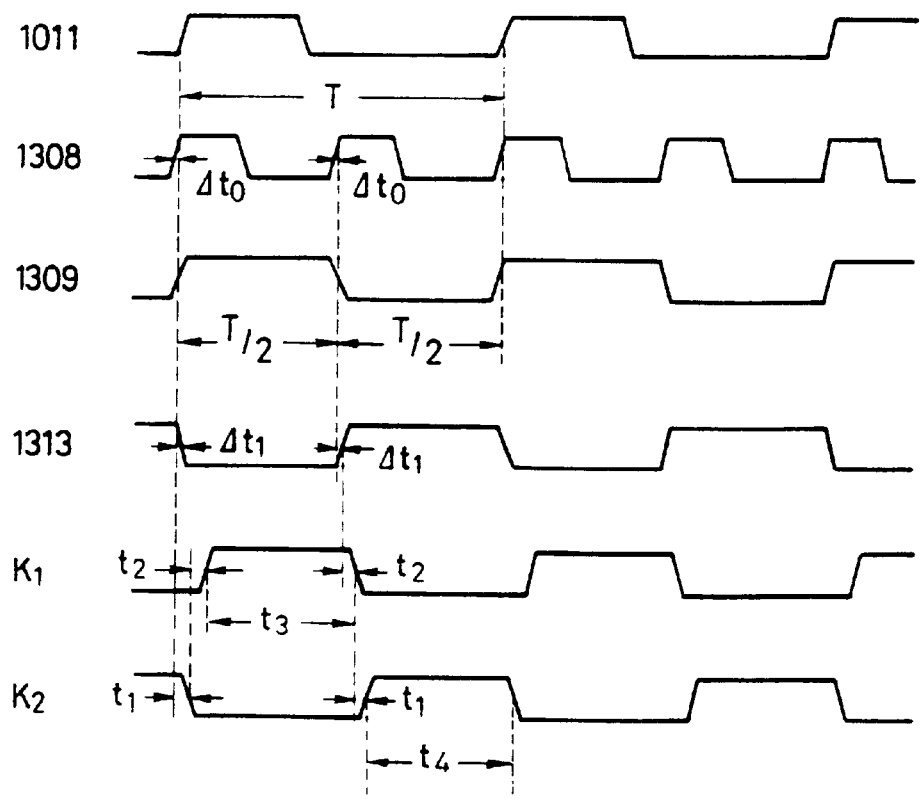

FIG. 18 is a waveform chart showing the operation of the arrangement shown in FIGS. 16 and 17. By the operation of the PLL consisting of the circuit elements 1301 to 1304, the clock signal 1309 which is phase-locked with the original signal 1011 and has a frequency equal to that of the signal 1011 is obtained. Accordingly, the oscillation output 1308 of the VCO 1303 before it is frequency-divided in the ½ frequency divider 1304 is delayed with respect to the original clock signal 1011 by a delay $\Delta t_0$ in the frequency divider 1304, so that the frequency of the output 1308 is twice that of the signal 1011. Since the output 1309 of the frequency divider 1304 is obtained by halving the frequency of the signal 1308, the output signal 1309 has a duty cycle of 50%. The signal 1313 is delayed with respect to the signal 1309 by a delay $\Delta t_1$, in the inverter 1310. Since each of the signals $K_1$ and $K_2$ is the output a two-input NOR circuit, the signal level is high when both the inputs are low in level.

More specifically, when either one of the signals $K_1$ and $K_2$ is at the high level, the other is infallibly at the low level; there is no possibility of these signals overlapping each other. The signal $K_1$ rises after the signal 1309 has risen and the signal K has fallen, that is, with a delay which is the sum of the delay $t_1$ in the NOR circuit 1312 and the delay $t_2$ in the NOR circuit 1311. On the other hand, the signal $K_2$ rises after the signal 1309 has fallen and the signal 1313 has risen and the signal $K_1$ has fallen, that is, with a delay which is the sum of the delay $\Delta t_1$ in the inverter 1310, the delay $t_2$ in the NOR circuit 1311 and the delay $t_1$ in the NOR circuit 1312. Accordingly, both the signals $K_1$ and $K_2$ are at the low level during the delay periods $t_2$ and $t_1$ concerning the NOR circuits 1311 and 1312, and it is possible to set these delays to as to be $t_1=t_2$ by employing the same circuit configuration for the NOR circuits 1311, 1312 and making the loads of the signals $K_1$, $K_2$ equal to each other. In regard to the pulse widths (the periods of time during which the signal level is high) $t_3$, $t_4$ the signals $K_1$ and $K_2$, the following equations hold:

$$\frac{T}{2} = t_1 + t_2 + t_3 - t_2 - \Delta t_1 \tag{1}$$
$$= t_1 + t_3 - \Delta t_1$$

$$\frac{T}{2} = \Delta t_1 + t_2 + t_1 + t_4 - t_1 \tag{2}$$
$$= t_2 + t_4 + \Delta t_1$$

(where T is the period)

From the equations (1) and (2), the following relation is obtained:

$$t_1+t_3-\Delta t_1=t_2+t_4+\Delta t_1 \tag{3}$$

Since the inverter 1310 needs to drive the NOR circuit 1311 only and the load of the signal line 1313 is exceedingly small, the delay At I in the inverter 1310 is so small that it can be ignored, as compared with the delays $t_2$ and $t_1$ in the NOR circuits 1311 and 1312. Accordingly, the equation (3) may be rearranged as follows:

$$t_1+t_3=t_2+t_4$$

Thus, if the delays $t_1$ and $t_2$ are set so as to be $t_1=t_2$ as described above, then the pulse widths $t_3$ and $t_4$ are equal to each other, i.e., $t_3=t_4$, so that it is possible to obtain ideal non-overlap two-phase clock signals. These two-phase clock signals $K_1$ and $K_2$ are generated on the basis of the signal 1309 synchronously with the original clock signal 1011 and therefore the phase relationship between the clock signals $K_1$, $K_2$ and the original clock signal K is kept constant.

Thus, it is possible to generate clock signals which are phase-locked with the signal 1011 (the original clock signal K) and which have a predetermined duty cycle.

In order to minimize the clock skew among a plurality of information processing units, it is preferable to employ clock generators having the same arrangement for the respective information processing units.

Figure 19:
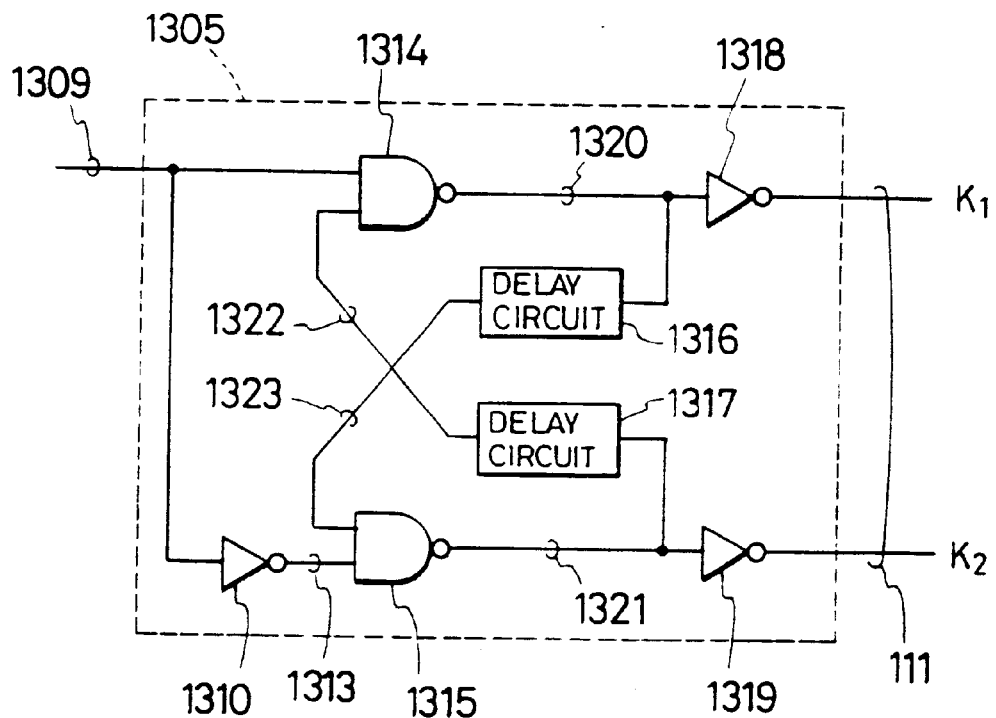

FIG. 19 shows another example of the gate-level arrangement of the clock generator 1305. In FIG. 19, the same reference numerals as those in FIG. 17 denote the same portions or functions.

The outputs 1320 and 1321 of two-input NAND circuits 1314 and 1315 are cross-coupled to first inputs of the NAND circuits through delay circuits 1316 and 1317, respectively, and second inputs of the NAND circuits 1314 and 1315 are respectively supplied with complementary signals 1309 and 1313. The outputs 1320 and 1321 are output through inverters 1318 and 1319 in the form of two-phase clock signals $K_1$ and $K_2$, respectively. Since in this arrangement the output of each two-input NAND circuit is fed back through a delay circuit, the signal $K_1$ rises after the signal 1309 has risen and a delay time given through the circuit elements 1310, 1315, 1317, 1314 and 1318 has elapsed. On the other hand, the signal $K_2$ falls after the signal 1309 has risen and a delay time given through the circuit elements 1310, 1315 and 1319 has elapsed. Accordingly, if the delays in the delay circuits 1316 and 1317 are set so as to be adequately longer than those in the other circuit elements, a period during which both the signals $K_1$ and $K_2$ are at the low levels can be set in the delay circuits 1316 and 1317.

Figure 20:
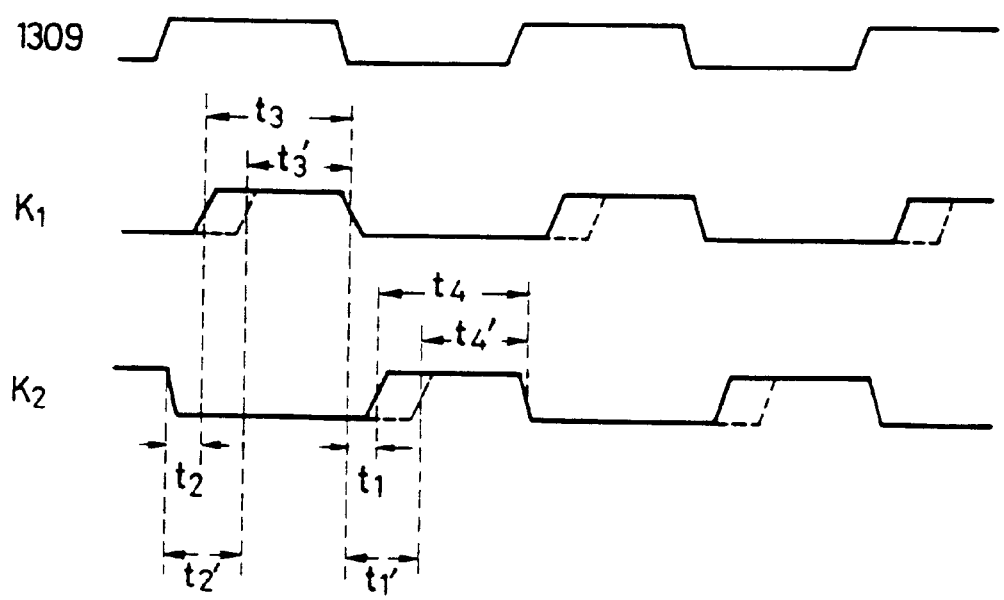

FIG. 20 is a waveform chart showing the operation of the arrangement shown in FIG. 19. The solid lines show waveforms in the case where the delay times set in the delay circuits 1316 and 1317 are relatively short, while the chain lines show waveforms in the case were said delay times are relatively long. More specifically, since the duty cycles of the two-phase clock signals $K_1$ and $K_2$ can be varied by changing the delay times set in the delay circuits 1316 and 1317, it is possible to obtain non-overlap two-phase clock signals having any desired duty cycles. Accordingly, employment of the circuit having the above-described arrangement enables the period of time during which both the non-overlap two-phase clock signals are at the low level to be set at a length adequate to cover the clock skew generated in the logic device.

Figure 21:
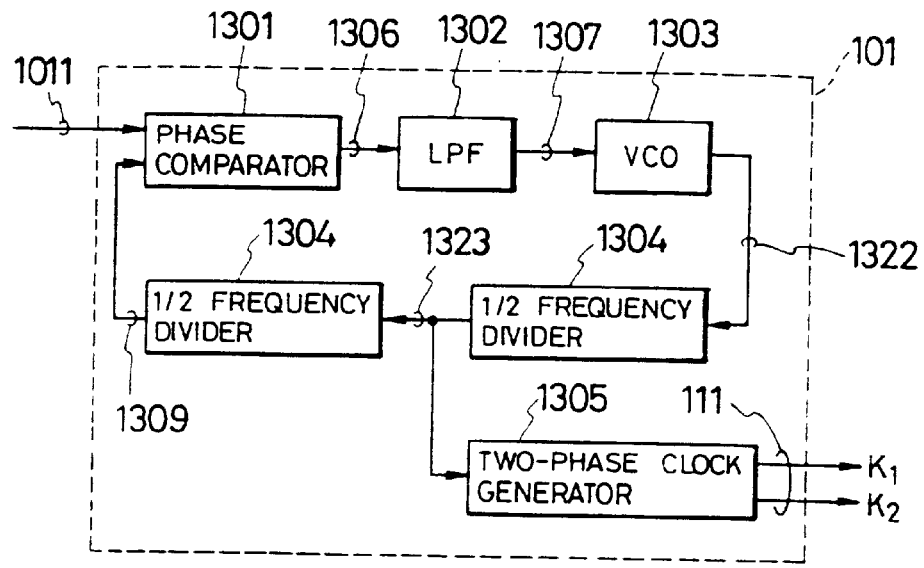

FIG. 21 shows one example of the arrangement of the clock generator 101 which receives a signal 1011 (the original clock signal K) and generates non-overlap two-phase clock signals $K_1$ and $K_2$ (corresponding to those shown in FIG. 15) with a predetermined duty cycle which have a frequency higher than that of the signal K (i.e., a frequency twice that of the latter) and which are phase-locked with the signal K. In FIG. 21, the same reference numerals as those in FIG. 16 denote the same portions or functions.

The arrangement shown in FIG. 21 differs from that shown in FIG. 16 in that another ½ frequency divider 1304 is added to the feedback loop of the PLL so that the frequency division is effected in two stages, and the output 1323 of the first-stage frequency divider 1304 is input to the two-phase clock generator 1305.

Figure 22:
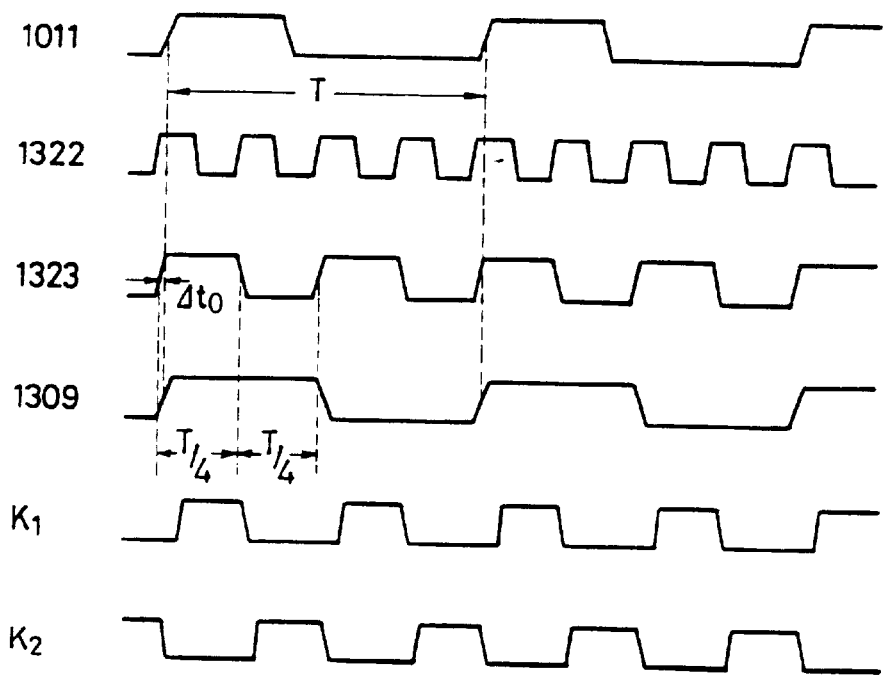

FIG. 22 is a waveform chart showing the operation of the arrangement shown in FIG. 21. Since the PLL effects feedback through two ½ frequency dividers connected in series, the output 1322 of the VCO 1303 has a frequency 4 times that of the signal 1011. Since the output 1323 of the first-stage frequency divider 1304 has been frequency-divided by two, the duty cycle of the output 1323 is 50%, and it is therefore possible to obtain a clock signal which has a frequency twice that of the signal 1011 and which is out of phase with the signal 1011 by an amount corresponding to the delay $\Delta t_0$ in the second-stage frequency divider 1304. Receiving the output 1323, the clock generator 1305 outputs non-overlap two-phase clock signals $K_1$ and $K_2$. Since the clock generator 1305 is capable of generating ideal non-overlap two-phase clock signals from a clock signal having a duty cycle of 50% as described above, it is possible in this arrangement also to obtain ideal non-overlap two-phase clock signals $K_1$ and $K_2$. Since the phase relationship between the signals 1323 and 1011 is constant (with a phase difference of $\Delta t_1$), the phase relationship between the signals $K_1$, $K_2$ and the signal 1011 is also constant.

Thus, it is possible to generate from an external low-frequency clock signal high-frequency clock signals which are phase-locked therewith and which have a predetermined duty cycle.

Figure 23:
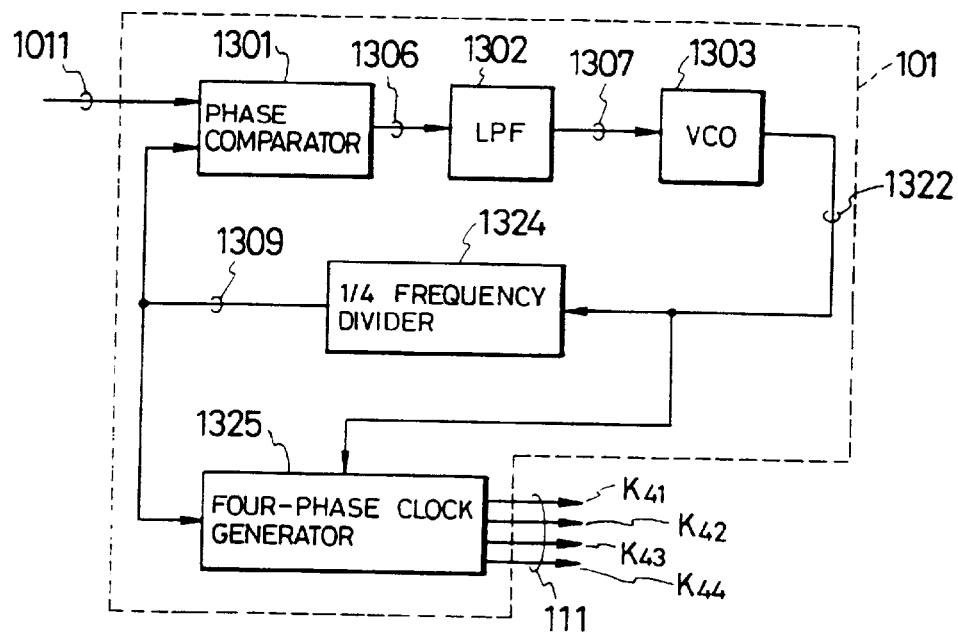

FIG. 23 shows one example of the arrangement of the clock generator 101 which receives a signal 1011 (the original clock signal K) and generates overlap four-phase clock signals $K_{41}$, K42, $K_{43}$ and $K_{44}$ which are phase-locked with the signal K and which have a predetermined duty cycle. In FIG. 23, the same reference numerals as those in FIG. 16 denote the same portions or functions. The PLL comprises a closed loop consisting of the circuit elements 1301, 1302, 1303 and a ¼ frequency divider 1324. Accordingly, the signals 1011 and 1309 are phase-locked with each other and have frequencies which are equal to each other. Since the closed loop in the PLL effects ¼ frequency division, the VCO 1303 oscillates at a frequency 4 times the frequency of the signal 1011 and outputs a clock signal 1322 which is out of phase with the signal 1309, that is, the signal 1011, by an amount corresponding to the delay $\Delta t_2$ in the frequency divider 1324. Since the signal 1309 is obtained by frequency-dividing the signal 1322, it has a duty cycle of 50%.

Figure 24:
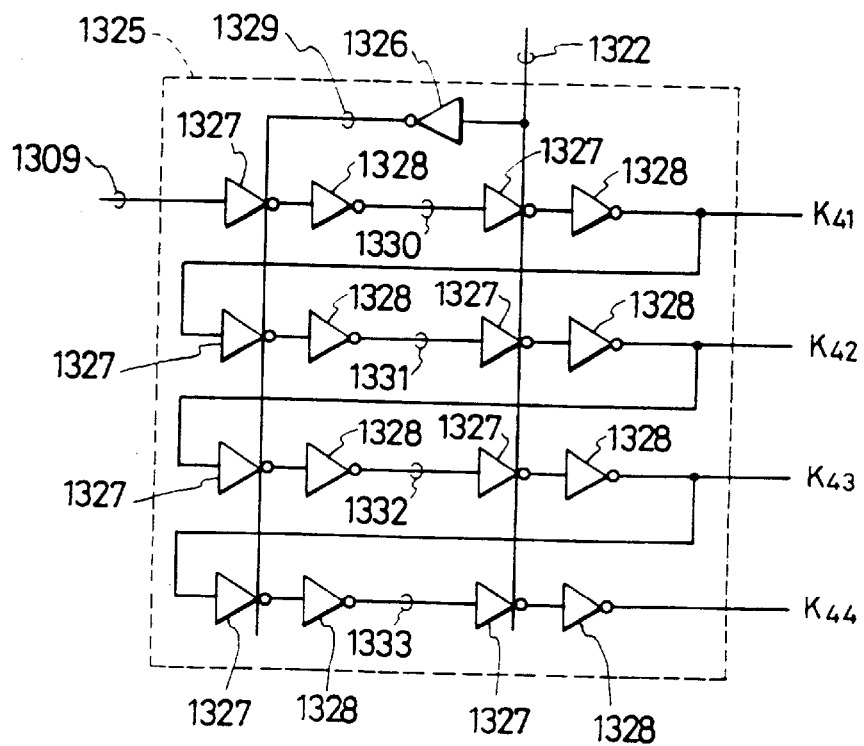

The four-phase clock generator 1325 outputs overlap four-phase clock signals $K_{41}$, $K_{42}$, $K_{43}$ and $K_{44}$ by shifting 900 the phase of the clock signal having a duty cycle of 50% by the clock signal 1322 having a frequency 4 times that of the signal 1309. FIG. 24 shows one example of the gate-level arrangement of the four-phase clock generator 1325.

Dynamic latches each consisting of a clocked inverter 1327 and an inverter 1328 are connected in series, and these dynamic latches are alternately controlled by complementary signals, i.e., an inverted signal 1329 of the signal 1322 by an inverter 1326 and the signal 1322, thereby constituting a shift register.

Figure 25:
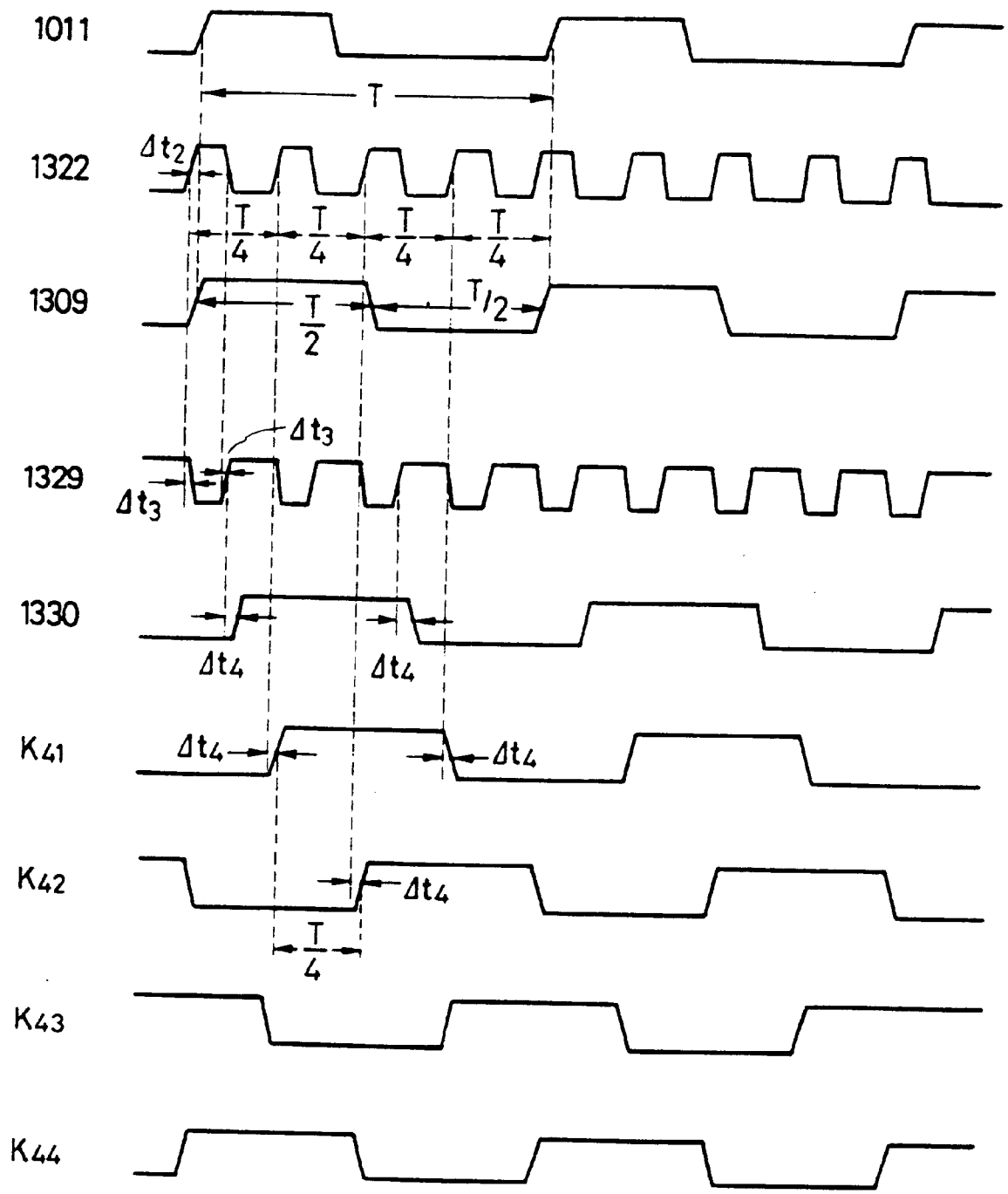

FIG. 25 is a waveform chart showing the operation of the arrangement shown in FIGS. 23 and 24. As described above, the signal 1322 has a frequency 4 times that of the signal 1011 and a phase difference of $\Delta t_2$ with respect to the signal 1011. The signal 1309 has the same frequency as that of the signal 1011 and is in phase with the latter. The duty cycle of the signal 1309 is 50%. The output 1330 of the first-stage dynamic latch consisting of the inverters 1327 and 1328 rises in synchronism with the first rise of the signal 1329 after the signal 1309 has risen, and falls in synchronism with the first fall of the signal 1329 after the signal 1309 has fallen. The output $K_{41}$ of the second-stage dynamic latch consisting of the inverters 1327 and 1328 rises in synchronism with the first rise of the signal 1322 after the signal 1330 has risen, and falls in synchronism with the first fall of the signal 1322 after the signal 1330 has fallen. Accordingly, the signal $K_{41}$ is delayed in phase with respect to the signal 1309 by an amount corresponding to one cycle of the signal 1322. This relationship similarly applies to the other pairs of signals $K_{41}$, $K_{42}$; $K_{42}$ and $K_{43}$; and $K_{43}$, $K_{44}$. Thus, the signals $K_{41}$, $K_{42}$, $K_{43}$ and $K_{44}$ are successively delayed in phase by one cycle of the signal 1322. Since the signal 1322 has a frequency 4 times that of the signal 1011, the signals $K_{41}$, $K_{42}$, $K_{43}$ and $K_{44}$ are successively 90' out of phase with each other. In other words, the signals $K_{41}$ to $K_{44}$ are ideal overlap four-phase clock signals. Since the phase relationship between the signals 1322 and 1011 is constant, the signals $K_{41}$, to $K_{44}$ which are synchronized with the signal 1322 have a fixed phase relationship with the signal 1011.

Thus, it is possible to generate clock signals which are phase-locked with the signal 1011 (the original clock signal K) and which have a predetermined duty cycle. It should be noted that, since in this arrangement the clock signal 1309 which has the same frequency as that of the signal 1011 is employed as a signal whose phase is shifted, and the clock signal 1322 having a frequency 4 times that of the signal 1011 is employed as a signal on the basis of which the phase of the signal 1309 is shifted, resulting overlap four-phase clock signals have the same frequency as that of the signal 1011, but the same is the case with the arrangement in which the frequencies of the signals 1309 and 1322 are multiples of the frequency of the signal 1011. Further, it is possible to obtain multi-phase clock signals having any desired number of phases by making the number of stages of the shift register constituting the clock generator 1325 equal to a multiple of the frequency of the signal 1309 which determines the frequency of the signal 1322.

Figure 26:
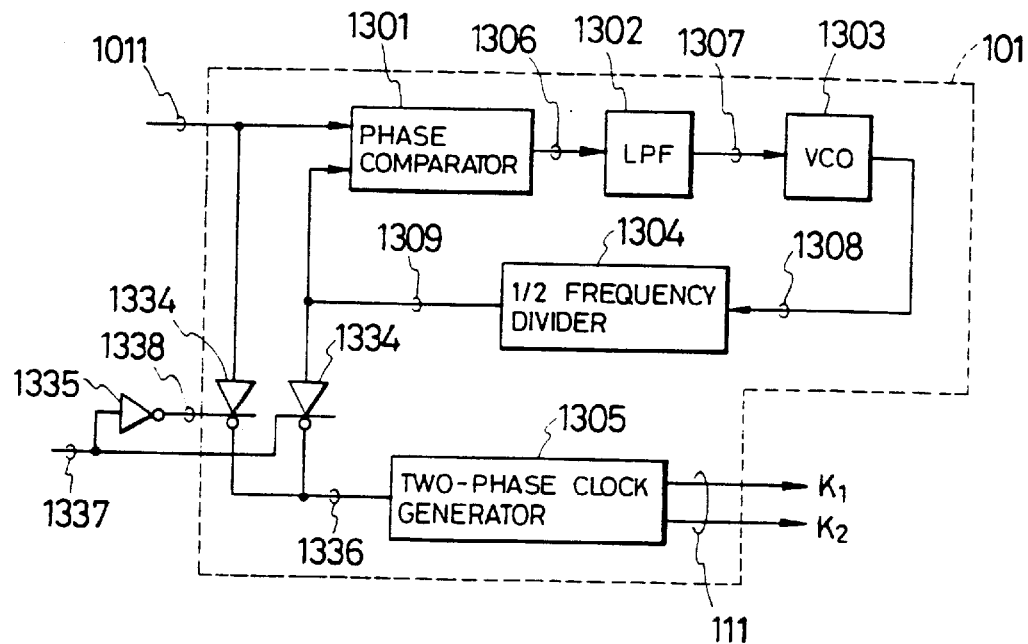

FIG. 26 shows one example of the arrangement of the clock generator 101 which receives a signal 1011 (the original clock signal K) and generates non-overlap two-phase clock signals $K_1$ and $K_2$ which have the same frequency as that of the signal K and are phase-locked therewith as well as having a predetermined duty cycle, the clock generator 101 further enabling such non-overlap two-phase clock signals to be generated directly from the signal 1011. In FIG. 26, the same reference numerals as those in FIG. 16 denotes the same portions or functions.

The arrangement shown in FIG. 26 differs from that shown in FIG. 16 in that a signal which is to be input to the two-phase clock generator 1305 is selected by a clocked inverter 1334 controlled by an external signal 1337 and a signal 1338 obtained by inverting the signal 1337 through an inverter 1325 in such a manner that, when the signal 1337 is high in level, the signal 1309 is input to the clock generator 1305, whereas, when the level of the signal 1309 is low, the signal 1011 is input to the clock generator 1305. It should be noted here that, since the clocked inverter 1334 is employed, the signals $K_1$ and $K_2$ are 1800 out of phase with the signal 1011.

More specifically, when two-phase clock signals having a predetermined duty cycle are needed to perform a high-speed operation, these clock signals are generated on the basis of a clock signal 1309 having a duty cycle of 50%, whereas, when the logic device is to be subjected to a functional diagnosis with low-frequency two-phase clock signals as in the case of a testing operation, two-phase clock signals can be generated directly from the clock signal 1011.

Figure 27:
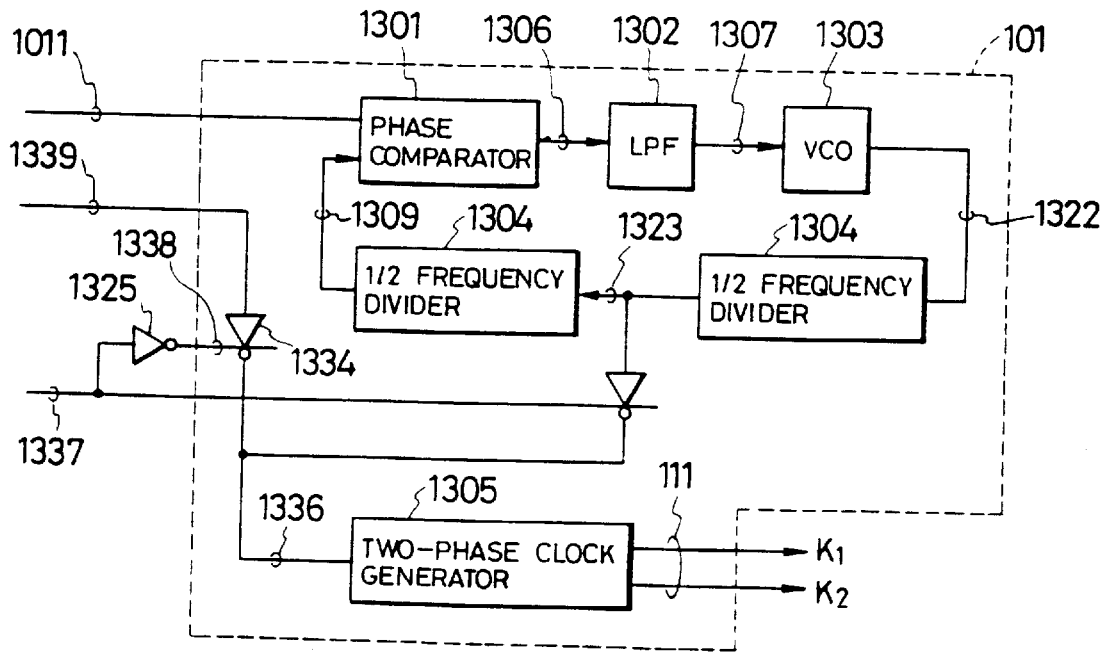
Figure 28:
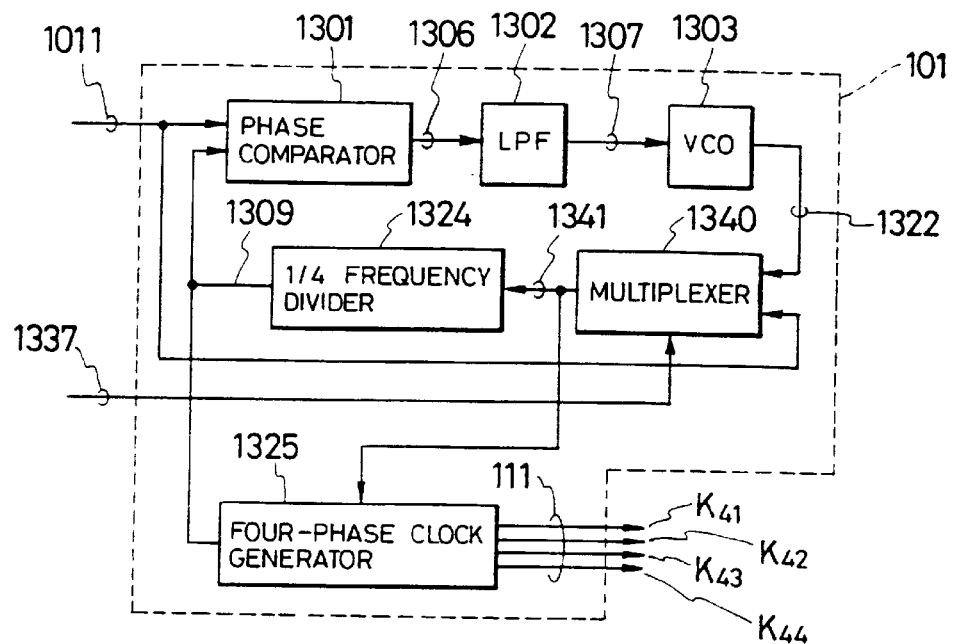

Thus, in this arrangement, when an internal device is to be operated at a low frequency, two-phase clock signals are generated directly from an external clock signal, whereas, when the internal device is to be operated at a high frequency, two-phase clock signals can be generated from a clock signal which is synchronized with the external clock signal and which has a duty cycle of 50%. Accordingly, it is advantageously possible to limit the oscillation frequency range for the oscillator in the clock generator. It is also possible to suspend the supply of clock signals and conduct a DC functional test at the time of diagnosis of the internal logic device. It should be noted that, although in the above-described arrangement non-overlap two-phase clock signals which have the same frequency as that of the original clock signal are generated, said arrangement may similarly apply to the generation of non-overlap two-phase clock signals having a frequency higher than that of the original clock signal, the generation of clock signals from an external clock signal which is different from the original clock signal, and the generation of overlap four-phase clock signals, as shown in FIGS. 27 and 28. More specifically, in regard to a clock generator which receives an original clock signal and generates at least one clock signal which is phase-locked with the original clock signal and which has a predetermined duty cycle, it is possible to obtain the foregoing advantageous effects by changing over a signal generated inside the clock generator and an externally input signal from one to the other as a signal which is to be input to a circuit which generates clock signals for controlling a logic device.

Figure 33:
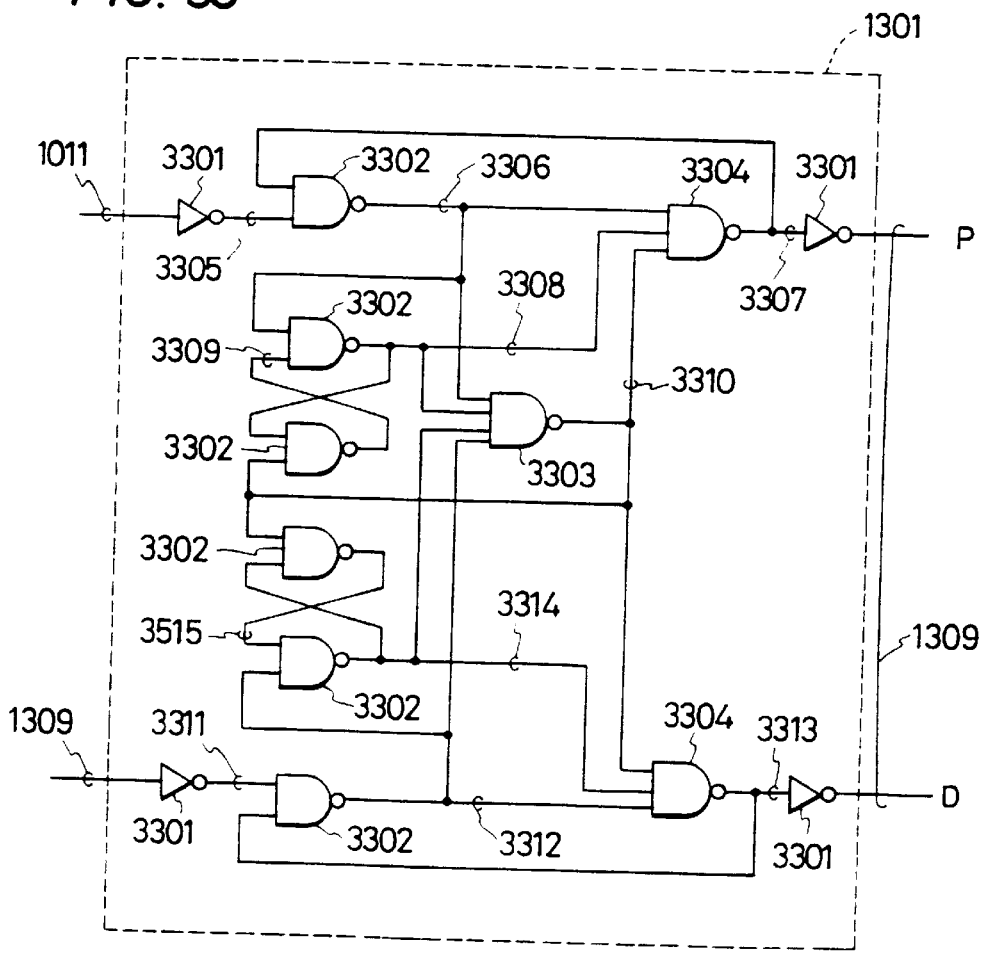

FIG. 33 shows one example of the arrangement of the phase comparator 1301 shown in FIG. 21. The reference numeral 3301 denotes inverters, 3302 two-input NANDS, 3303 a four-input NAND, and 3304 a three-input NAND.

Figures 35A, 35B:
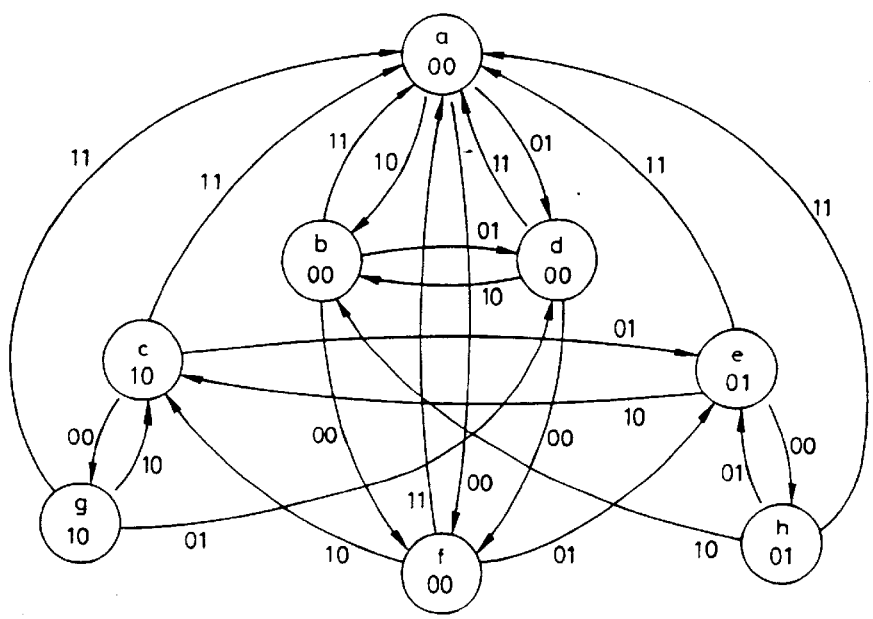

FIGS. 35(a) and 35(b) are a state diagram and a state transition diagram, respectively, showing the operation of the phase comparator 1301. The phase comparator 1301 has eight different states, i.e., a, b, c, d, e, f, g and h. A pair of values shown in each of the eight circles that show the respective states are the outputs "P, D" of the phase comparator 1301. The values shown beside the arrows that represent the transitions of the states are the inputs "1011, 1309" of the phase comparator 1301 which cause the respective state transitions. As will be understood from these figures, the output P of the phase comparator 1301 is raised to a high level in either the state c or g, whereas, the output D is raised to a high level in either the state e or h. More specifically, in the phase relationship between the inputs 1011 and 1309 of the phase comparator 1301, when the input 1309 is in retard of the input 1011, the output P is at the high level during the period of time from the rise of the input 1011 to the rise of the input 1309, whereas, when the input 1309 is in advance of the input 1011, the output D is at the high level during the period of time from the rise of the input 1309 to the rise of the input 1011.

Figure 36:
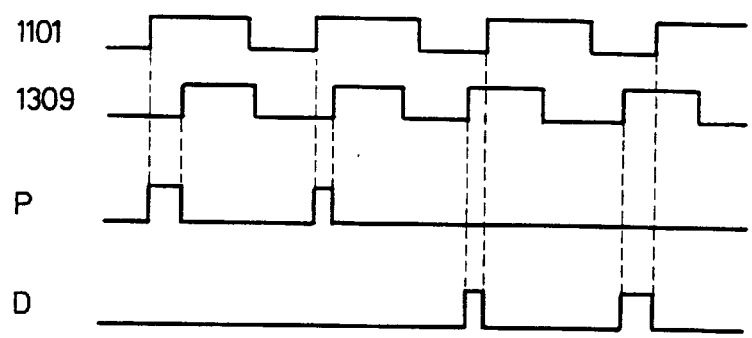

FIG. 36 is a time chart showing the operation of the phase comparator 1301. As will be clear from the description in relation to FIGS. 35(a) and 35(b), the output P is at the high-level during the period when the input 1011 is at the high level but the input 1309 has not yet risen. On the other hand, the output D is at the high level during the period when the input 1309 is at the high level but the input 1101 has not yet risen. The phase comparator 1301 operates as described above.

Figure 37:
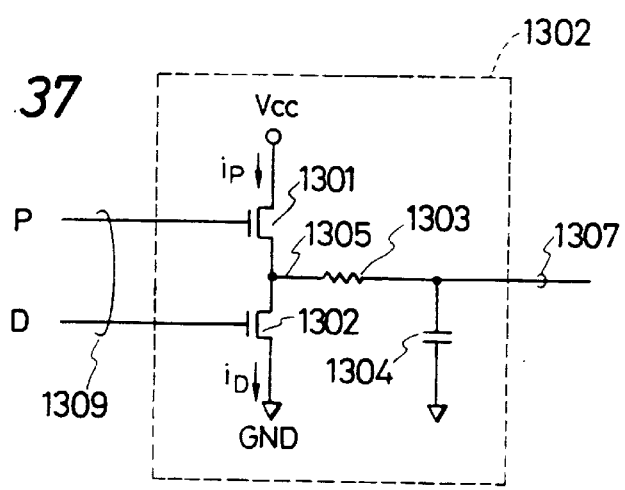

FIG. 37 shows one example of the arrangement of the low-pass filter 1302 shown in FIG. 21, which is a circuit known as a "charge pump". The reference numerals 1301 and 1302 denote NMOS transistors, 1303 a resistor, and 1304 a static capacitance.

Figure 38:
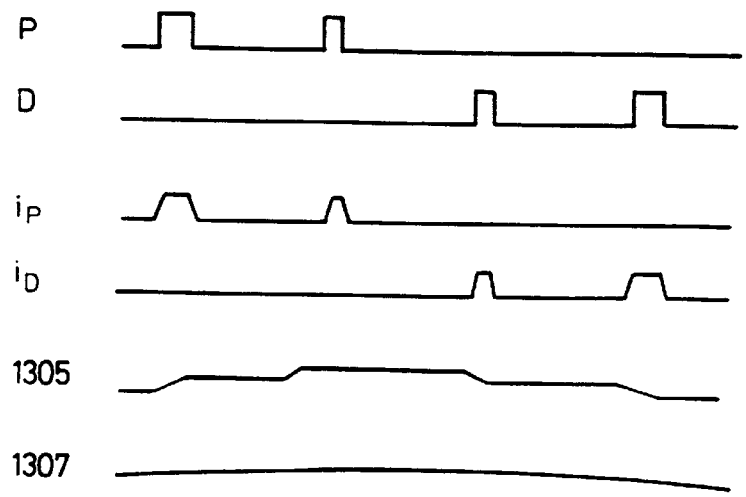

FIG. 38 is a timing chart showing the operation of the low-pass filter shown in FIG. 37. When the input P is at the high level, NMOS 1301 is ON, and the pulse current $i_P$ flows, resulting in a rise in the potential at the mode 1305. On the other hand, when the input D is at the high level, the MNOS 1302 is ON, and the pulse current $i_D$ flows, resulting in a lowering in the potential at the node 1305. The potential at the node 1305 is delivered in the form of an output 1307 after being smoothed through a low-pass filter consisting of the resistor 1303 and the capacitance 1304. As will be understood from the foregoing description, the circuit 1302 causes a potential change from the potential of the output 1307 in proportion to the respective pulse widths of the inputs P and D.

Figure 39:
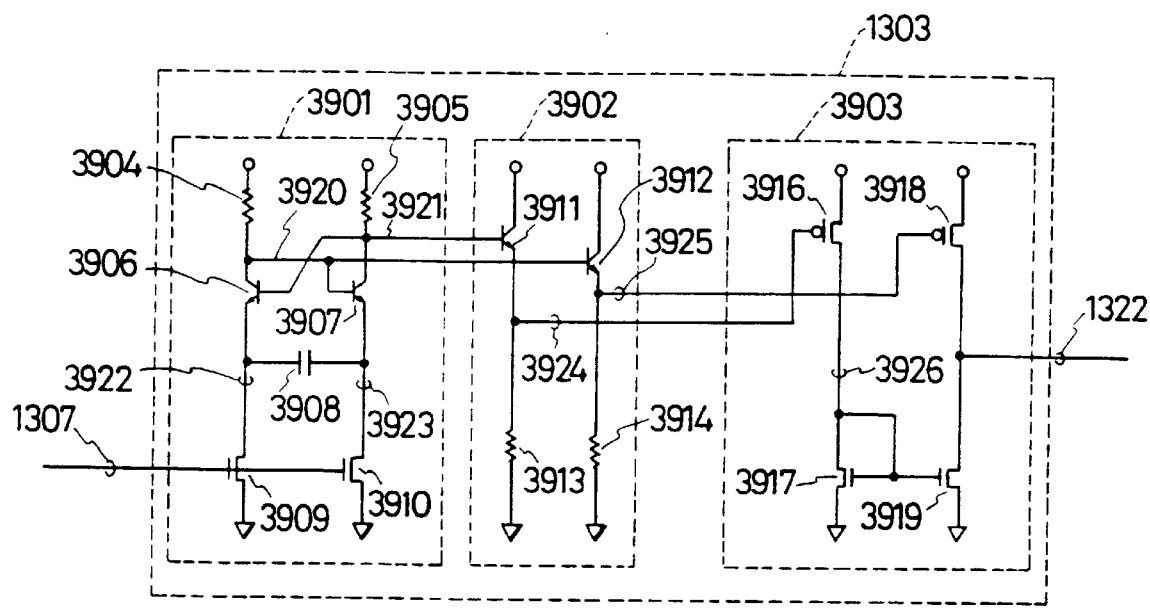

FIG. 39 shows one example of the arrangement of the VCO 1303 shown in FIG. 21. In FIG. 39, the reference numeral 3901 denotes a multivibrator, 3902 a level shifter, and 3903 a level converter.

In the multivibrator 3901, NPN transistors 3906 and 3907 which are cross-coupled at the collectors and bases perform a switching operation in such a manner that, when either one of the transistors 3906 and 3907 is ON, the other is OFF. Thus, the NPN transistors 3906 and 3907 constitute in combination a monostable multivibrator. Resistors 3904 and 3905 are connected to the respective collectors of the transistors 3906 and 3907 so that a current is supplied thereto from a power supply Vcc through these resistors. The emitters of the transistors 3906 and 3907 are connected to each other through a capacitor 3908 and are grounded through NMOS transistors 3909 and 3910, respectively. The gates of the transistors 3909 and 3910 are supplied with a signal 1307 which is the output of the LPF 1302 and which serves as a control voltage input to the VCO 1303, thus constituting a bypass current source which supplies a current corresponding to the voltage value of the signal 1307.

The multivibrator 3901 operates as follows. Let us consider first the case where the transistor 3906 is ON, while the transistor 3907 is OFF. Assuming that the current supplied by each of the transistors 3909 and 3910 is I, a current 2I supplied by the transistors 3909 and 3910 flows through the resistor 3904, and the current I supplied by the transistor 3910 from the node 3922 toward the node 3923 flows through the capacitor 3908. Accordingly, the potential at the node 3920 becomes lower than Vcc by an amount corresponding to the voltage drop caused by the resistor 3904, whereas the potential at the node 3921 is pulled up to Vcc by the action of the resistor 3905. Since the transistor 3906 is ON, the node 3922 is placed at a potential which is lower than that at the node 3921 by $V_{BE}$ of the bipolar transistor (i.e., the base-emitter voltage required for the bipolar transistor to turn ON, which is generally about 0.8 V in the case of a Si transistor). Since the current I flows through the capacitor 3908, if the capacitance of the capacitor 3908 is assumed to be C, the potential between the nodes 3922 and 3923, that is, the potential across the capacitor 3908, is I/C and changes with time. When the potential the node 3923 is lower than that at the node 3920 by $V_{BE}$, the transistor 3907 turns ON, so that the current I which has flowed through the capacitor 3908 now flows through the transistor 3907 via the resistor 3905. In consequence, the potential at the node 3921 lowers by an amount corresponding to the voltage drop caused by the resistor 3905, and therefore the voltage between the nodes 3921 and 3922 becomes lower than $V_{BE}$, resulting in the transistor 3906 turning OFF.

Figure 40:
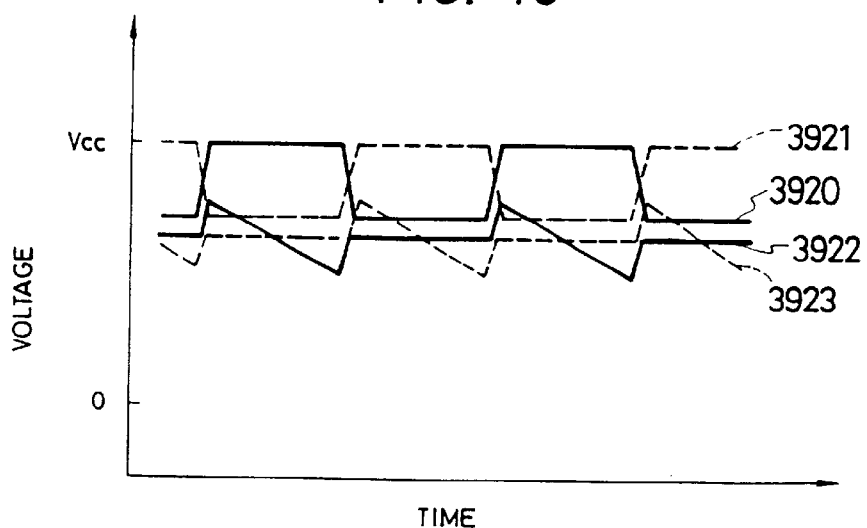

In other words, in the multivibrator 3901, two transistors are alternately switched. FIG. 40 is a waveform chart showing the operation of the multivibrator 3901. As will be clear from the figure, it is possible in the multivibrator 3901 to obtain differential signals 3920 and 3921. Since the oscillation frequency of the signals depends on the current I supplied to the transistors 3909 and 3910, it is possible to vary the frequency by changing the current value I. However, since the output amplitude of the multivibrator is small, it is necessary, in the case where CMOS transistors are employed to constitute an internal circuit, to amplify the output of the multivibrator to the logical amplitude of the CMOS transistors.

The reference numeral 3903 denotes a level converter of the VCO 1303, while the numeral 3902 denotes a level shifter which connects together the multivibrator 3901 and the level converter 3903.

In the level shifter 3902, a series circuit consisting of NPN transistors 3911, 3912 and resistors 3913, 3914 lowers the differential outputs 3920, 3921 of the multivibrator 3901 which are input to the respective bases of the transistors 39111, 3912 by $V_{BE}$, and outputs the lowered signals 3925, 3924 to the level converter 3903.

In the level converter 3903, the outputs 3924, 3925 of the level shifter 3902 are supplied to the respective gates of PMOS transistors 3916, 3918 which constitute, together with NMOS transistors 3917, 3919, a series circuit in which the gates of the transistors 3917, 3919 are mutually connected to the node between these transistors 3917, 3919. More specifically, when the current flowing through the transistor 3916 increases, the voltage drop in the transistor 3917 increases, and the impedance of the transistor 3919 decreases. In this case, the current flowing through the transistor 3918 is small, and therefore the output 1322 is low. On the other hand, when the current flowing through the transistor 3916 decreases, the voltage drop in the transistor 3917 decreases, and the impedance of the transistor 3919 increases. In this case, the current flowing through the transistor 3918 is large, and therefore the output 1322 is high. In other words, since the level converter 3903 performs a push-pull operation, the amplitude of the output 1322 is large.

Thus, it is possible in this example of the arrangement to realize a VCO having a CMOS-level output.

Figure 31:
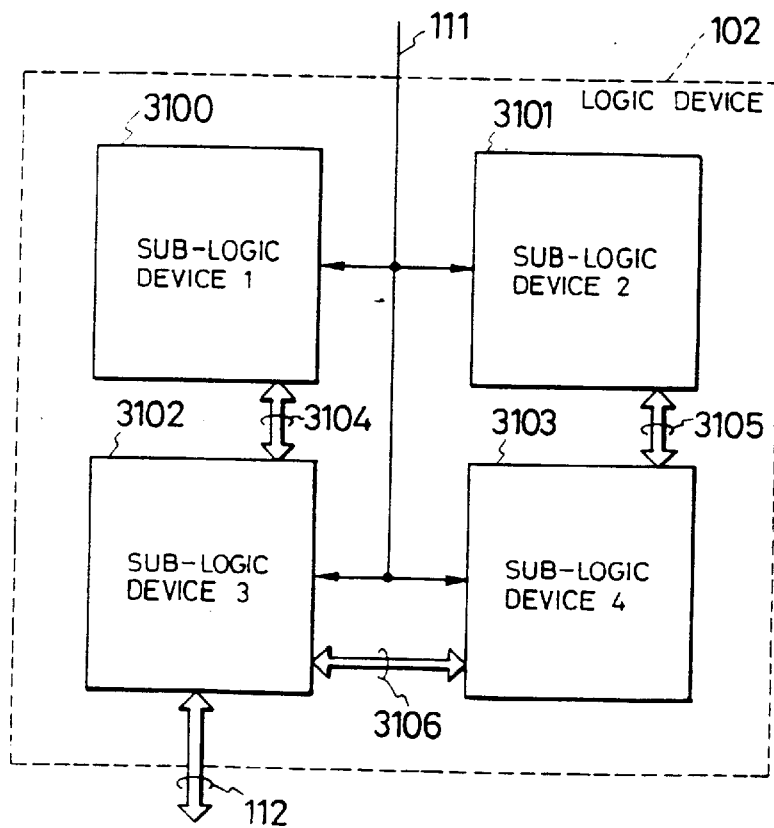
FIGS. 31 to 40 show in combination one example of the arrangement of one embodiment of the present invention.

FIG. 31 shows another example of the arrangement of the logic device 102 shown in FIG. 1. The reference numerals 3100 to 3103 denote four sub-logic devices constituting in combination the logic device 102 shown in FIG. 1. The numerals 3104 to 3106 denote interfaces between the sub-logic devices. Each sub-logic device operates in synchronism with the clock signal 111.

Figure 32:
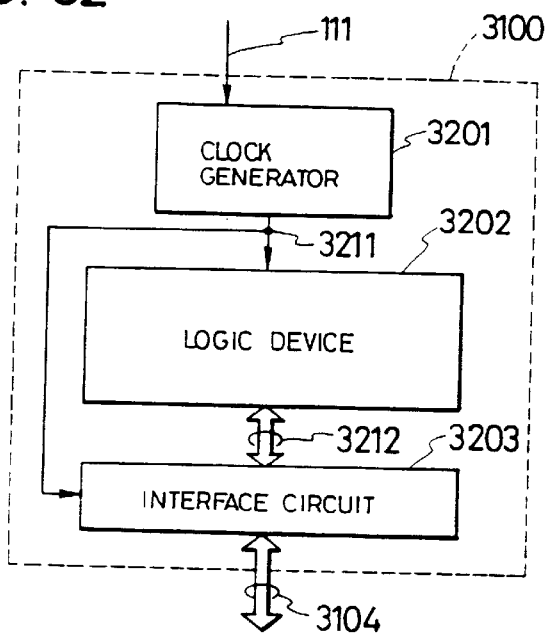

FIG. 32 shows the arrangement of the sub-logic device 3100. The reference numeral 3201 denotes a clock generator, 3202 a logic device, and 3203 an interface circuit. The numeral 3211 denotes a clock signal for controlling the logic device 3202. In other words, the sub-logic device 3100 has the same arrangement as the information processing unit 1002. By adopting such a hierarchy arrangement, it is possible to raise the clock frequency gradually in such a manner that, for example, 1 MHz is used for the original clock signal 1011 synchronizing the information processing units, 10 MHz for the clock signal 111 for synchronizing the sub-logic devices, and 100 MHz for the clock signal for controlling the logic device 3202. The hierarchy arrangement enables the machine cycle to be reduced while maintaining at a low frequency clock signals distributed throughout an information processor even if it is a large-scale one.

One embodiment of the present invention will be described hereinunder with reference to FIG. 41.

Figure 41:
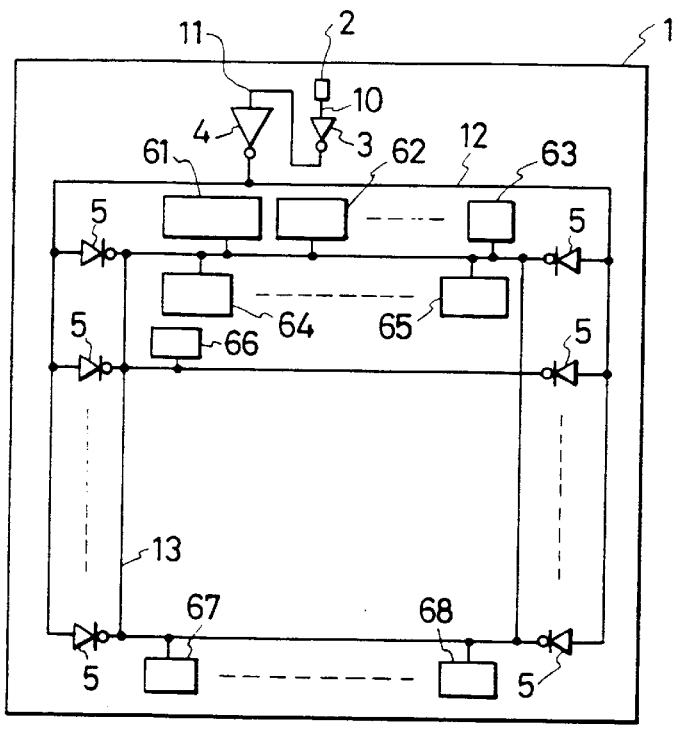
FIG. 41 shows the general arrangement of one embodiment of the present invention.
Figure 42:
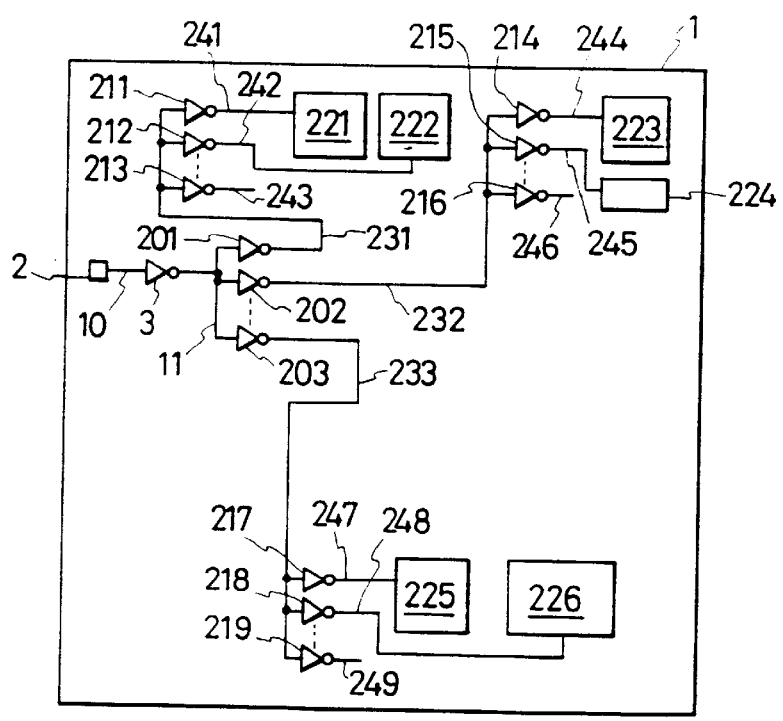
FIGS. 42 and 43 show prior arts, respectively.
Figure 43:
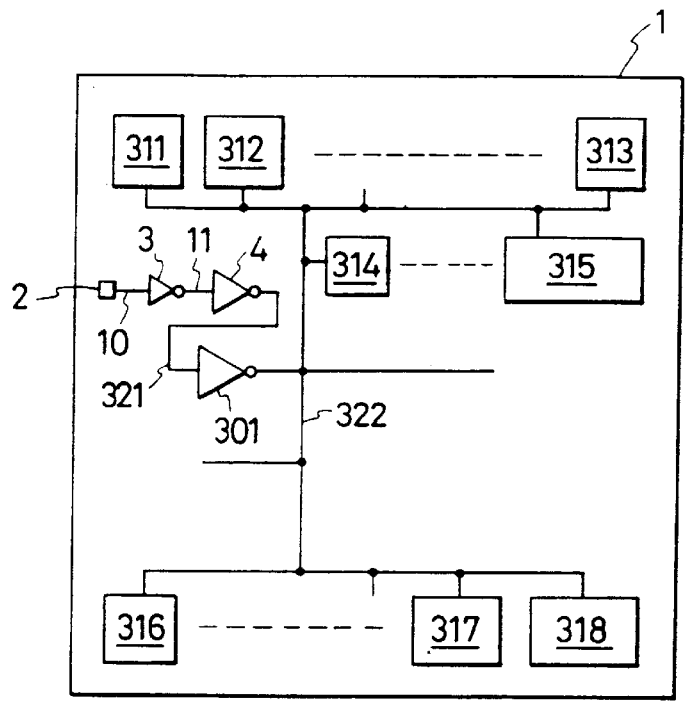

Referring to FIG. 41, which shows an information processor comprising an integrated circuit fabricated on a single semiconductor substrate, the reference numeral 1 denotes a semiconductor substrate, 2 a pad, 3 an input buffer, 4 a clock internal buffer, 5 tri-state buffers each incorporating a diagnostic circuit, and 61 to 68 logic circuit blocks which are controlled by clock signals. It should be noted that, in FIG. 41, illustration of diagnostic wirings or the like of the tri-state buffer 5 is omitted (the diagnostic circuit will be described later).

An external clock signal 10 which is input to the pad 2 is formed into an internal clock signal 11 through the input buffer 3. The clock signal 11 is formed into a clock signal 12 through the buffer 4, the clock signal 12 being input to a parallel circuit consisting of the tri-state buffers 5 which are disposed at the peripheral portion of the semiconductor substrate 1, and the clock signal 12 being delivered through a signal wiring laid along the peripheral portion of the semiconductor substrate 1. The parallel circuit of the tri-state buffers 5 incorporates a tri-state control circuit which activates a desired one of the tri-state buffers 5 and places the other buffers 5 in a high-impedance state at the time of diagnosis, to that it is possible to check the operation of a desired one of the tri-state buffers 5 and hence check all the tri-state buffers 5. Thus, the parallel circuit of tri-state buffers 5 receives the clock signal 12 and supplies clock signals 13 for controlling the logic circuit blocks 61 to 68 which are laid in the shape of a ladder inside the semiconductor substrate 1 so as to be dispersed throughout the inside of the semiconductor substrate 1, and in this case, it is possible to reliably supply the controlling clock signals 13 in parallel to each other with the parallel circuit of buffers 5 by activating all the tri-state buffers 5. It should be noted that, when the parallel circuit is constituted by buffers generally employed in place of the tri-state buffers 5 each incorporating a diagnostic circuit in accordance with this embodiment, even if one of the buffers constituting the parallel circuit normally operates but the other buffers are out of order, the parallel circuit may assume to operate normally; therefore, the tri-state buffers may not necessarily operate parallel with each other.

By virtue of the above-described arrangement, the load which needs to be driven by each tri-state buffer 5 is reduced, and therefore the delay caused by the parallel circuit of tri-state buffers 5 is small. Further, the time required for the controlling clock signals 13 to rise or fall is also reduced, which results in a decrease in the current flowing through the internal logic circuit of each of the logic circuit blocks 61 to 68. In the logic circuit blocks 61 to 68, there is no clock skew because they are controlled by the clock signals 13 of the same kind, and therefore there is no fear of errors in exchange of signals between the logic circuit blocks 61 to 68. Since the parallel circuit consisting of tri-state buffers 5 is disposed at the peripheral portion of the semiconductor substrate 1, noise generated in power supply and grounding lines when the parallel circuit drives a large load consisting of the wirings for the controlling clock signals 13 which are laid in the shape of a ladder inside the semiconductor substrate 1 and the logic circuit blocks 61 to 68 which are objects of control is also dispersed to the peripheral portion of the semiconductor substrate 1, and therefore there is no fear of a mal-operation of the logic circuits in the logic circuit blocks 61 to 68. Further, since the parallel circuit of tri-state buffers 5 is disposed at the peripheral portion of the semiconductor substrate 1, it suffices to lay wiring for the parallel circuit along the peripheral portion of the semiconductor substrate 1, and it is easy to lay the ladder-shaped wiring for the controlling clock signals 13 throughout the inside of the semiconductor substrate 1. Thus, it is possible to realize an efficient layout.

This embodiment has the foregoing advantageous effects and therefore enables realization of a high-performance information processor.

The arrangement of one tri-state buffer incorporating a diagnostic circuit will next be described in detail with reference to FIG. 44.

Figure 44:
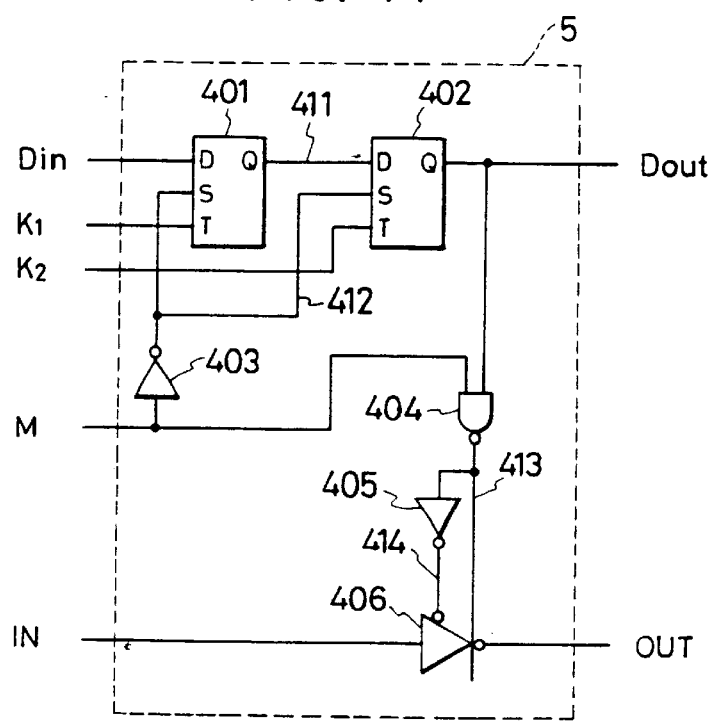

In FIG. 44, the reference numerals 401 and 402 denote D-type flip-flops (D-FF's) having a setting function, 403, 405 inverters, 404 a two-input NAND, and 406 a tri-state inverter.

FIG. 45 shows one example of the arrangement of one D-FF, while FIG. 46 is a state diagram showing the operation of the D-FF. More specifically, when the set terminal S is "1", the output Q is "1". When the set terminal S is "0" and the control terminal T is "0", the D-FF functions as a larch which holds the previous value, whereas, when the set terminal S is "0" and the control terminal T is "1", the D-FF delivers the value at the data terminal D as an output Q.

More specifically, referring to FIG. 44, the D-FF's 401 and 402 constitute in combination a shift register which is controlled by diagnostic clock signals $K_1$ and $K_2$ so as to shift the content of a diagnostic control data input $D_{in}$ and deliver a diagnostic control data output $D_{out}$ When a diagnostic signal M is "0", the level at the node 413 is always "1" by the operation of the two-input NAND 404, and the signal 414 inverted through the inverter 405 is "0", thus causing the tri-state inverter 406 to be activated to deliver the inverted signal of the input IN as an output OUT. The output 412 obtained by inverting the diagnostic signal M through the inverter 403 is "1" and input to the terminals S of the D-FF's 401 and 402, and the outputs 411 and D out from the respective terminals Q of the D-FF's 401 and 402 are thereby set to "1". On the other hand, when the signal M is "1", the state of the tri-state inverter 406 is changed by the operation of the two-input NAND 404 such that, when the value of the output D out is "1", the inverter 406 is placed in a high-impedance state, whereas, when the output value is "0", the inverter 406 is brought into an operative state.

Thus, the tri-state buffer incorporating a diagnostic circuit is enabled to be selectively brought into an operative state and a high-impedance state in accordance with the signals $D_{in}$, $K_1$, $K_2$ and M.

One example of the arrangement in which the tri-state buffer incorporating a diagnostic circuit which is shown in FIG. 44 is employed to realize the above-described parallel circuit on a semiconductor integrated circuit will next be described in detail with reference to FIG. 47.

In FIG. 47, the reference numerals 701 to 703 denote tri-state buffers each incorporating a diagnostic circuit. The respective terminals $K_1$, $K_2$, M, IN and OUT of the tri-state buffers 701 to 703 are connected in parallel to input or output clock signals $K_1'$, $K_2'$ for a diagnosis made in the semiconductor integrated circuit, a diagnostic signal M' and clock signals 12, 13 which are input and output signals respectively, in relation to the parallel circuit of tri-state buffers each incorporating a diagnostic circuit. The terminals $D_{in}$, and $D_{out}$ of the tri-state buffers 701 to 703 are connected in such a manner that control data D for a diagnosis in the semiconductor integrated circuit is input to the terminal $D_{in}$ of the tri-state buffer 701, the terminal $D_{out}$ of the buffer 701 is connected to the terminal $D_{in}$ of the buffer 702, and the terminal $D_{out}$ of the buffer 702 is connected to the terminal $D_{in}$ of the buffer 703, thereby series-connecting the tri-state buffers constituting the parallel circuit. More specifically, since the terminals $D_{in}$ and $D_{out}$ of each of the tri-state buffers 701 to 703 constitute a shift register controlled by the clock signals $K_1$ and $K_2$, $D_{in}$ and $D_{out}$ of all the tri-state buffers 701 to 703 also constitute in combination a shift register which is controlled by the diagnostic clock signals $K_1'$ and $K_2'$ so as to shift the content of D.

The following is a description of a diagnosis made in order to check the operation of each of the tri-state buffers incorporating respective diagnostic circuits and constituting a parallel circuit which is realized on a semiconductor integrated circuit, as shown in FIG. 47. The description will be made with reference to FIG. 48.

Figure 48:
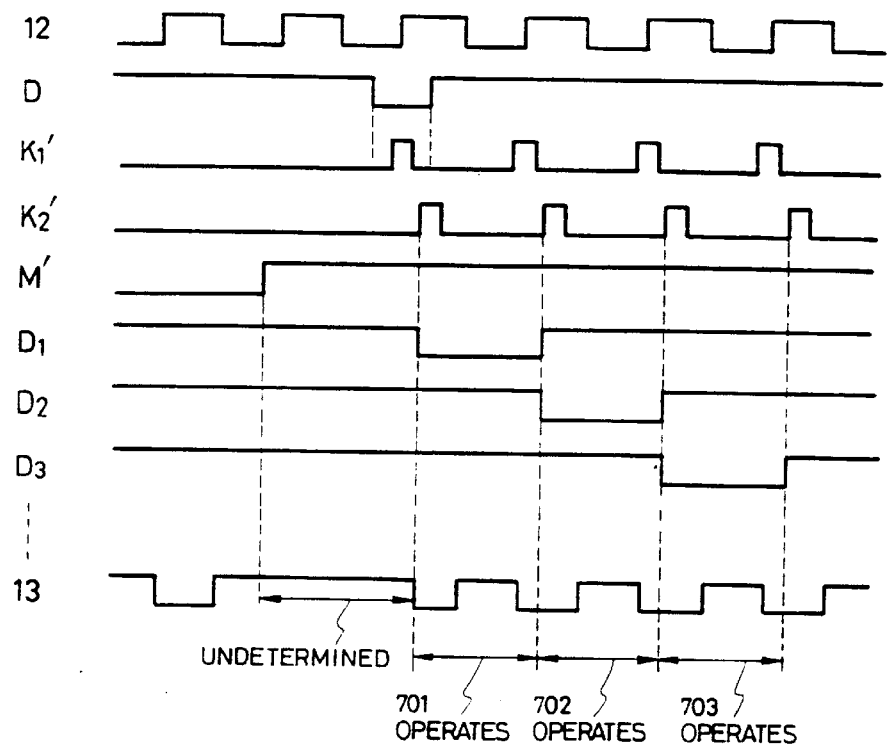
FIG. 48 is a time chart showing the operation of the arrangement shown in FIG. 47.

FIG. 48 is a time chart showing the operation of the arrangement shown in FIG. 47.

When the signal M' is "0", all the tri-state buffers 701 to 703 are activated. Data "1" is written in the shift register provided inside each of the tri-state buffers 701 to 703. Accordingly, the tri-state buffers 701 to 703 are driven parallel with each other so as to deliver an inverted signal of the signal 12 to the line 13.

When the signal M' is "1", the state of the tri-state buffers 701 to 703 is determined by the data $D_{out}$, whereas, when the signal M' is "0", all the bits of bits of data are "1". Therefore, all the tri-state buffers 701 to 703 are brought into a high-impedance state., and the state of the line 13 is undetermined.

When the signal D is at "0", if the signal $K_1'$ is input (i.e., $K_1'$ is changed from "0" to "1" and then changed back to "0"), "0" is written in the first stage of the internal shift register of the tri-state buffer 701, whereas, if the signal $K_2'$ is input, "0" is written in the second-stage of the internal shift register of the tri-state buffer 701. More specifically, since the signal $D_1$ which is the output $D_{out}$ of the tri-state buffer 701 is "0", the buffer 701 is activated alone. Since, at this time, the tri-state buffer 701 alone is driven with the signal 12 input thereto, it is possible to check the operation of the tri-state buffer 701 by confirming that, when the data on the line 12 is set to "0" or "1", the data on the line 13 is "1 " or "0", i.e., the inversion of the data on the line 12.

Next, if D is changed to "1 " before the signal $K_1'$ is input and the signals $K_1'$ and $K_2'$ are then input, data "0" is written again in the shift register of the tri-state buffer 701, and the buffer 701 is therefore brought into a high-impedance state. However, at this time, data "0" is written in the shift register of the tri-state buffer 702 having the signal data $D_1$ already input thereto. Accordingly, the signal $D_2$ is changed to "0", and the tri-state buffer 702 is activated. Thus, it is possible to check the operation of the buffer 702.

Thereafter, every time the signals $K_1'$ and $K_2'$ are input, tri-state buffers which are to be activated are sequentially shifted, and it is therefore possible to check the operation of all the tri-state buffers.

Thus, according to the diagnostic circuit and diagnostic method according to this arrangement, it is possible to activate all the tri-state buffers using the semiconductor integrated circuit diagnostic signal M' only. Therefore, it is easy to control tri-state buffers each incorporating a diagnostic circuit when they are employed as clock drivers. At the time of diagnosis, a signal for controlling the state of each of the tri-state buffers can be successively shifted so as to be supplied to the buffers in response to the diagnostic clock signals $K_1$ ' and $K_2'$. Accordingly, it becomes easy to check the operation of the tri-state buffers and it is possible to reduce the time required to complete the diagnosis.

Another embodiment of the present invention will next be described with reference to FIG. 49.

Figure 49:
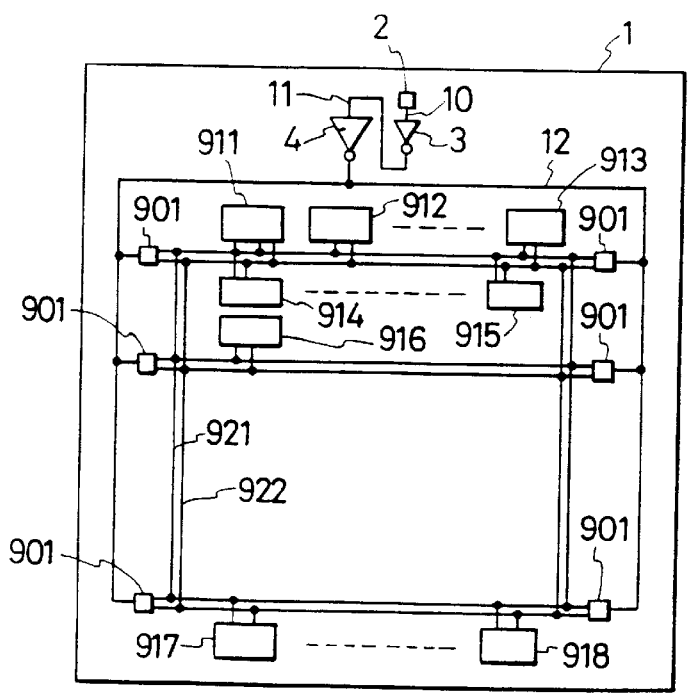
FIG. 49 shows the general arrangement of another embodiment of the present invention.

In FIG. 49, the same reference numerals as those in FIG. 41 denote the same portions or functions. The arrangement shown in FIG. 49 differs from that shown in FIG. 41 in that logic circuit blocks 911 to 918 are controlled by two-phase clock signals 921 and 922 and therefore each clock supply circuit is constituted by a two-phase clock generating tri-state circuit incorporating a diagnostic circuit. The operation and effects of this embodiment are similar to those in the case of the embodiment shown in FIG. 41.

The arrangement of one two-phase clock generating tri-state circuit incorporating a diagnostic circuit will next be explained in detail with reference to FIG. 50.

Figure 50:
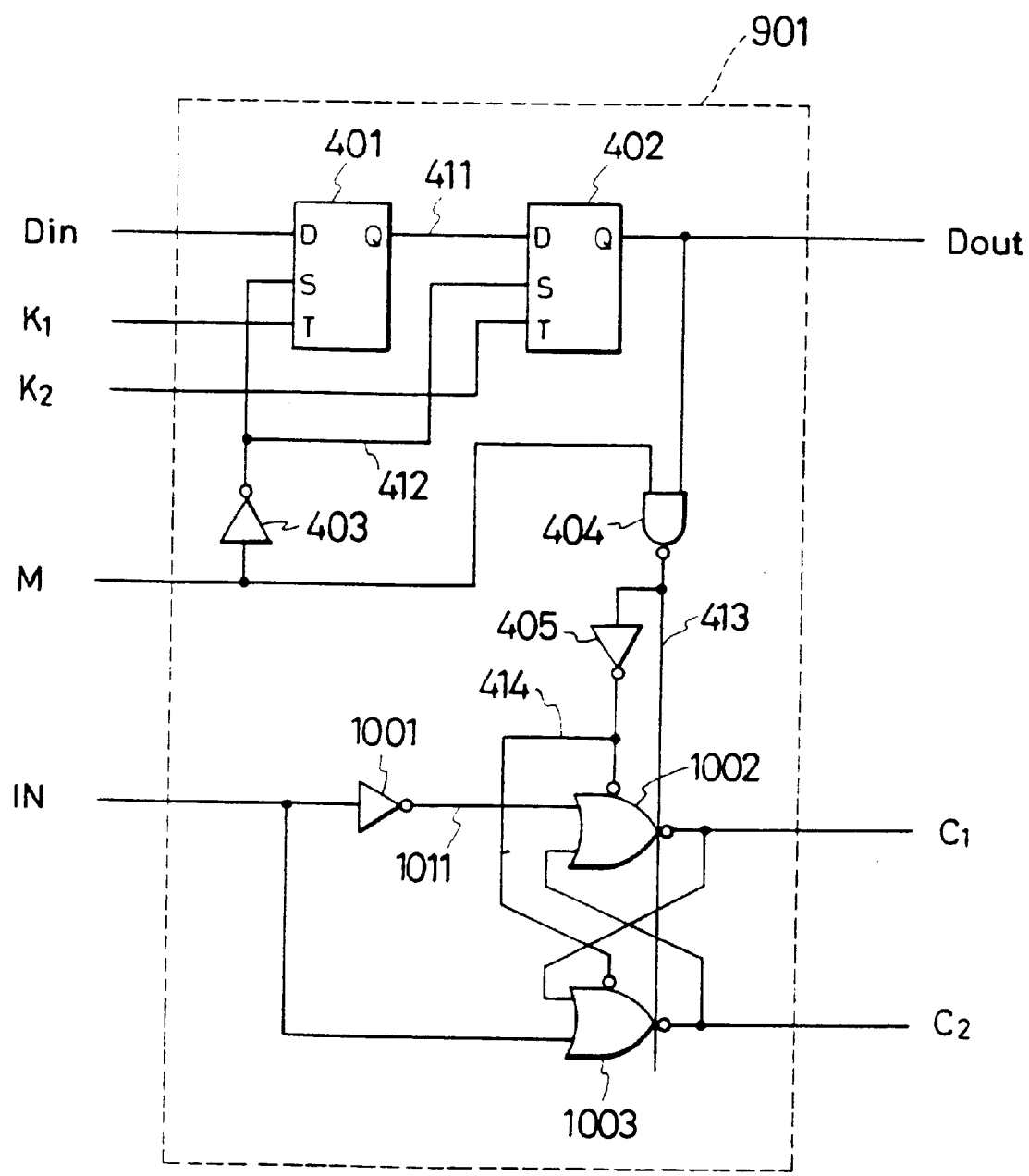
FIGS. 50 and 51 show in detail the arrangement of the embodiment shown in FIG. 49.

In FIG. 50, the same reference numerals as those in FIG. 44 denote the same portions or functions. The arrangement shown in FIG. 50 differs from that shown in FIG. 44 in that first inputs and outputs of tri-state two-input NOR circuits 1002 and 1003 are cross-coupled and second inputs of the NOR circuits 1002 and 1003 are respectively supplied with complementary signals, i.e., an inverted signal 1011 of IN by an inverter 1001 and IN. Accordingly, when both the tri-state two-input NOR circuits 1002 and 1003 are in an operative state there is no possibility that both the outputs $\overline{C_1}$ and $\overline{C_2}$ of the NOR circuits 1002 and 1003 will be "1"; when one of them changes from "1" to "0", the other infallibly changes from "0" to "1". Thus, non-overlap two-phase clock signals are generated. The other operations of this arrangement are the same as those of the arrangement shown in FIG. 44.

One example of the arrangement in which the two-phase clock generating tri-state circuit incorporating a diagnostic circuit which is shown in FIG. 50 is employed to realize the above-described parallel circuit on a semiconductor integrated circuit will next be described in detail with reference to FIG. 51.

Figure 51:
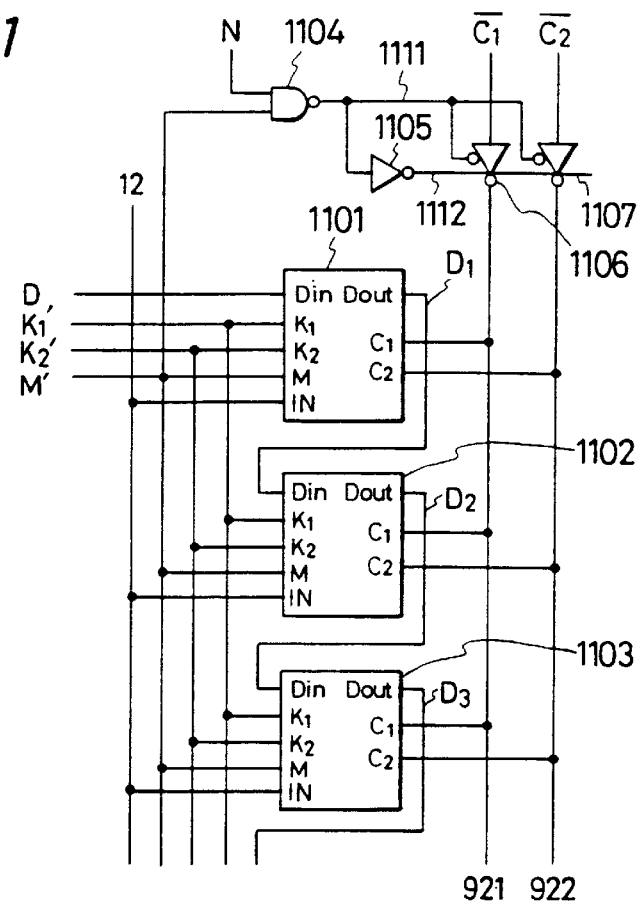

In FIG. 51, the same reference numerals as those shown in FIG. 47 denote the same portions of functions. The arrangement shown in FIG. 51 differs from that shown in FIG. 47 in that two-phase clock generating tri-state circuits 1101 to 1103 each incorporating a diagnostic circuit are employed to constitute a parallel circuit and data can be input to two-phase clock signal lines 921 and 922 from $\overline{C_1}$ and $\overline{C_2}$ through tri-state inverters 1106 and 1107. More specifically, when the signal M' is "0", an output node 1111 is placed at "1" by the operation of the two-input NAND circuit 1104, while an inverted output 1112 is placed at "0" by the operation of an inverter 1105, so that the tri-state inverters 1106 and 1107 are brought into a high-impedance state, whereas, when the signal M' is "1", if a two-phase clock control signal N is "1", the output node 1111 is "0", while the node 1112 is "1", so that the tri-state inverters 1106 and 1107 are activated to output inverted signals of $\overline{C_1}$ and $\overline{C_2}$ to the lines 921 and 922, respectively.

Confirmation of the operation of each of the two-phase clock generating tri-state circuits constituting the parallel circuit is carried out in the same way as in the case of the first-described embodiment. Therefore, the method of setting the two-phase clock signals 921 and 922 on the basis of $\overline{C_1}$ and $\overline{C_2}$ will be explained hereinunder with reference to FIG. 52.

Figure 52:
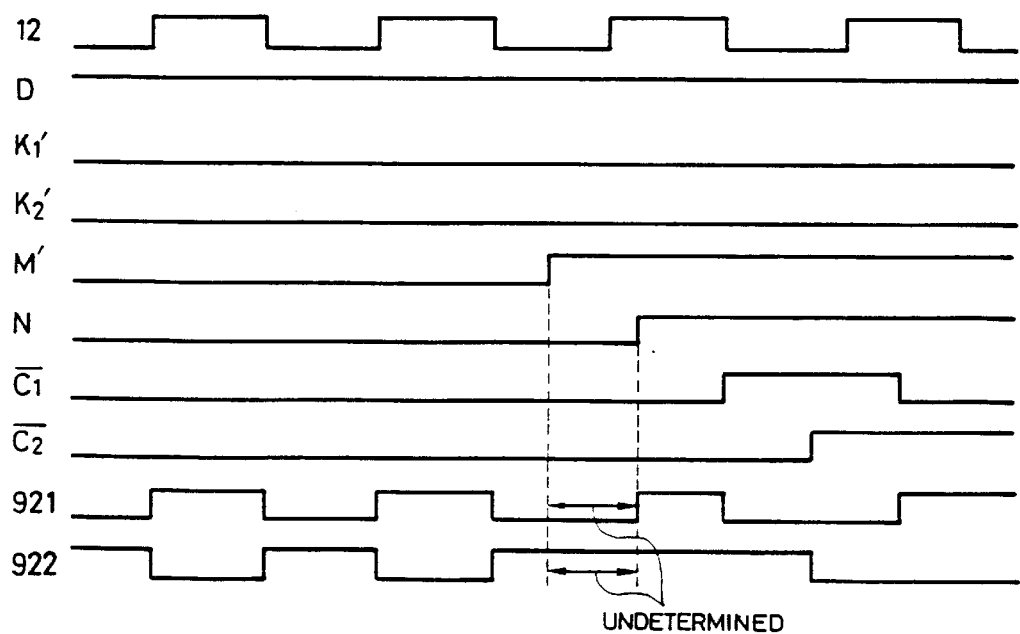
FIG. 52 is a time chart showing the operation of the arrangement shown in FIG. 51.

FIG. 52 is a time chart showing the operation of the arrangement shown in FIG. 51.

When the signal M' is "0", all the tri-state circuits 1101 to 1103 are in an operative state, while the tri-state inverters 1106 and 1107 are in a high-impedance state. Accordingly, the signals 921 and 922 are non-overlap two-phase clock signals and these signals are supplied parallel by the tri-state buffers 1101 to 1103.

When the signal M' is changed to "1", all the tri-state buffers 1101 to 1103 are brought into a high-impedance state, and if, in this state, the signal N is "0", the tri-state inverters 1106 and 1107 are also placed in a high-impedance state, so that the signals 921 and 922 are undetermined.

When the signal N is changed to "1", the tri-state inverters 1106 and 1107 are activated to supply inverted signals of $\overline{C_1}$ and $\overline{C_2}$ to the signal lines 921 and 922. Thus, it is possible to realize desired data on the signal lines 921 and 922 in accordance with the data of $\overline{C_1}$ and $\overline{C_2}$. More specifically, it is possible to set a clock state (e.g., a state wherein neither the signal 921 nor 922 is "1") which cannot be realize in the two-phase clock generating tri-state circuit shown in FIG. 50. Accordingly, it becomes easy to check the operation of the logic circuits controlled by the signals 921 and 922.

According to the present invention, a clock generating means for generating at least one clock signal $K_1$ which is phase-locked with an original clock signal K is provided inside each of the information processing 3inits constituting an information processor. Therefore, it is possible to synchronize the information processing units with each other.

Since the clock generating means according to the present invention generates a clock signal $K_1$ having a predetermined duty cycle, it is possible to generate a clock signal having a precise duty cycle. Since it is necessary to distribute the generated clock signal only within each information processing unit, it is possible to distribute within a logic device a clock signal $K_1$, having a minimized clock skew and a minimized duty cycle fluctuation.

Further, it is possible according to the present invention to synchronize a low-frequency original clock signal supplied from the outside of an information processing unit with a high-frequency clock signal inside the information processing unit, it is therefore possible to maintain the external original clock signal at a low frequency while improving the machine cycle of the information processing unit.

According to the present invention, all the logic circuits in an information processor which are controlled by clock signals are supplied with these clock signals in the form of outputs of a parallel circuit consisting of tri-state circuits each incorporating a diagnostic circuit. Therefore, it is possible to eliminate the clock skew, reduce the clock signal delay time and shorten the time required for the clock signals to rise or fall. Accordingly, it is possible to reduce the time margin for prevention of a malfunction due to clock signals in the information processor and hence raise the frequency of the external clock signal.

What is claimed is:

1. A data processing apparatus, integrated on a single semiconductor substrate, and coupled to an external memory via address bus, comprising:

a clock generator having a phase lock loop circuit which includes a divider; and a logic device coupled to said clock generator, wherein said clock generator receives a first clock signal from an oscillator, divides said first clock signal using said divider, and outputs a second clock signal from the divider whose frequency is higher than that of said first clock signal, and wherein said logic device receives said second clock signal from said clock generator, and performs decoding and processing of commands.

2. A data processing apparatus according to claim 1, wherein said frequency of said second clock signal is a multiple of said first clock signal.

3. A data processing apparatus according to claim 1, wherein said data processing apparatus includes a PMOS transistor and a NMOS transistor.

4. A data processing apparatus according to claim 1, wherein said logic device is coupled to the address bus and memory address is delivered to said address bus.

5. A data processing apparatus coupled to a memory via a data bus, and integrated on a single semiconductor substrate, comprising:

a clock generator, coupled to an oscillator, having a phase lock loop circuit which includes a divider; and a logic device coupled to said bus and clock generator, wherein said clock generator receives a first clock signal from the oscillator, divides said first clock signal using said divider and outputs a second clock signal from the divider whose frequency is a multiple of said first clock signal, and wherein said logic device receives said second clock signal from said clock generator, and loads data from the memory.

6. A data processing apparatus according to claim 5, wherein said logic device executes floating-point arithmetic.

7. A data processing apparatus according to claim 5, wherein said data processing apparatus includes a CMOS transistor.

8. A data processing apparatus, comprising:

a clock generator including a phase lock loop circuit;

a logic device coupled to said clock generator, wherein said clock generator receives a first clock signal and generates a second clock signal, and wherein said logic device receives said second clock signal from said clock generator and performs decoding and processing of commands; and clock signal switching means, responsive to an external control signal, for selectively supplying to said logic device either said second clock signal generated by said clock generator, when said logic device is not to be subjected to functional testing, or an external clock signal, when said logic device is to be subjected to functional testing.

9. A data processing apparatus according to claim 8, wherein said clock generator and said clock signal switching means are formed on a single semiconductor integrated circuit chip.

* * * * *